US011387231B2

(12) United States Patent
Shimizu et al.

(10) Patent No.: US 11,387,231 B2
(45) Date of Patent: Jul. 12, 2022

(54) SEMICONDUCTOR DEVICE

(71) Applicant: Mitsubishi Electric Corporation, Tokyo (JP)

(72) Inventors: Kazuhiro Shimizu, Tokyo (JP); Yuji Kawasaki, Tokyo (JP); Toshihiro Imasaka, Tokyo (JP); Manabu Yoshino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 80 days.

(21) Appl. No.: 17/017,995

(22) Filed: Sep. 11, 2020

(65) Prior Publication Data

US 2021/0151427 A1 May 20, 2021

(30) Foreign Application Priority Data

Nov. 14, 2019 (JP) .............................. JP2019-206408

(51) Int. Cl.
*H01L 29/06* (2006.01)
*H01L 27/06* (2006.01)
(Continued)

(52) U.S. Cl.
CPC ...... *H01L 27/0617* (2013.01); *H01L 27/0629* (2013.01); *H01L 27/0922* (2013.01);
(Continued)

(58) Field of Classification Search
CPC ......... H01L 29/66613; H01L 29/66681; H01L 29/7824; H01L 29/0696; H01L 29/0852;
(Continued)

(56) References Cited

U.S. PATENT DOCUMENTS

2003/0218186 A1* 11/2003 Hano .................. H01L 27/0629
257/197
2006/0118860 A1* 6/2006 Hatade ............ H01L 21/823814
257/E21.639
(Continued)

FOREIGN PATENT DOCUMENTS

| EP | 0743752 A1 | 11/1996 |
|---|---|---|
| JP | 2004-200359 A | 7/2004 |
| WO | 94/27370 A1 | 11/1994 |

OTHER PUBLICATIONS

An Office Action mailed by the United States Patent and Trademark Office dated Mar. 11, 2022, issued in U.S. Appl. No. 17/017,995 which is related to U.S. Appl. No. 17/017,995.

*Primary Examiner* — Samuel Park
(74) *Attorney, Agent, or Firm* — Studebaker & Brackett PC

(57) ABSTRACT

The semiconductor device that supplies a charging current to a bootstrap capacitor includes a semiconductor layer, an $N^+$-type diffusion region, an N-type diffusion region, a $P^+$-type diffusion region, a P-type diffusion region, an $N^+$-type diffusion region, a source electrode, a drain electrode, a back gate electrode, and a gate electrode. The $N^+$-type diffusion region and the N-type diffusion region are electrically connected to a first electrode of the bootstrap capacitor. The $N^+$-type diffusion region is supplied with a power supply voltage. The source electrode is connected to the $N^+$-type diffusion region and is supplied with the power supply voltage. The back gate electrode is connected to a region separated from the $N^+$-type diffusion region and is grounded. The breakdown voltage between the source electrode and the back gate electrode is greater than the power supply voltage.

7 Claims, 14 Drawing Sheets

(51) Int. Cl.
*H03K 17/687* (2006.01)
*H01L 27/092* (2006.01)
*H01L 27/07* (2006.01)

(52) U.S. Cl.
CPC ...... *H03K 17/6872* (2013.01); *H01L 27/0738* (2013.01); *H01L 29/0684* (2013.01)

(58) Field of Classification Search
CPC ............. H01L 29/1045; H01L 29/1095; H01L 29/66674; H01L 29/78012; H01L 29/7816; H01L 27/0617; H01L 27/0629; H01L 27/0922; H01L 27/0738; H01L 29/0684; H03K 17/6872; H03K 17/0822; H03K 2217/0081
See application file for complete search history.

(56) References Cited

U.S. PATENT DOCUMENTS

| | | |
|---|---|---|
| 2008/0009113 A1 | 1/2008 | Shimizu |
| 2010/0148823 A1 | 6/2010 | Shimizu |
| 2014/0167171 A1 | 6/2014 | Kaya et al. |
| 2015/0115342 A1* | 4/2015 | Kaya ................... H01L 27/0285 257/296 |
| 2015/0270390 A1 | 9/2015 | Kaya et al. |
| 2017/0062567 A1 | 3/2017 | Kaya et al. |
| 2017/0345887 A1 | 11/2017 | Ichikawa |

* cited by examiner

SEMICONDUCTOR DEVICE

BACKGROUND OF THE INVENTION

Field of the Invention

The present disclosure relates to a semiconductor device.

Description of the Background Art

Conventionally, a semiconductor device provided with a bootstrap capacitor is known (for example, see European Patent Application No. 743752). The bootstrap capacitor is included in a bootstrap circuit that is used to ensure a proper power supply to a driver circuit biased to a high potential. In the semiconductor device mentioned above, the bootstrap capacitor, which serves as a target element to be charged, is basically charged in a very short time. Therefore, as disclosed in European Patent Application No. 743752, the bootstrap capacitor is charged via a LDMOS (Laterally Diffused Metal Oxide Semiconductor) transistor that may operate as a substitute for a high breakdown voltage diode.

SUMMARY OF THE INVENTION

In the semiconductor device mentioned above, in order to prevent the semiconductor device from being damaged by the operation of a parasitic transistor that includes the LDMOS transistor, the source potential control circuit and the back gate potential control circuit are connected. The two control circuits control the potentials of the source electrode and the back gate electrode of the LDMOS transistor so as to prevent the parasitic transistor from operating. Such a complicated circuit including the source potential control circuit and the back gate potential control circuit is a main factor that increases the manufacturing cost of the semiconductor device.

The present disclosure has been made in view of the above problems, and an object of the present disclosure is to provide a semiconductor device capable of reducing the manufacturing cost.

A semiconductor device according to the present disclosure is a semiconductor device that supplies a charging current to charge a target element, and includes a semiconductor layer of a first conductivity type, a first semiconductor region of a second conductivity type, a second semiconductor region of the first conductivity type, a third semiconductor region of the second conductivity type, a source electrode, a drain electrode, a back gate electrode, and a gate electrode. The first semiconductor region is electrically connected to the first electrode of the target element. The first semiconductor region is formed on the main surface of the semiconductor layer. The second semiconductor region is formed on the main surface of the semiconductor layer and arranged adjacent to the first semiconductor region. The third semiconductor region is formed on the surface of the second semiconductor region and is supplied with a power supply voltage. The source electrode is connected to the third semiconductor region and is supplied with the power supply voltage. The drain electrode is connected to the first semiconductor region and is electrically connected to the first electrode. The back gate electrode is connected to a region in the second semiconductor region separated from the third semiconductor region and is grounded. The gate electrode is arranged to face a channel region located in the second semiconductor region between the third semiconductor region and the first semiconductor region with a gate insulating film interposed therebetween. The breakdown voltage between the source electrode and the back gate electrode is greater than the power supply voltage.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
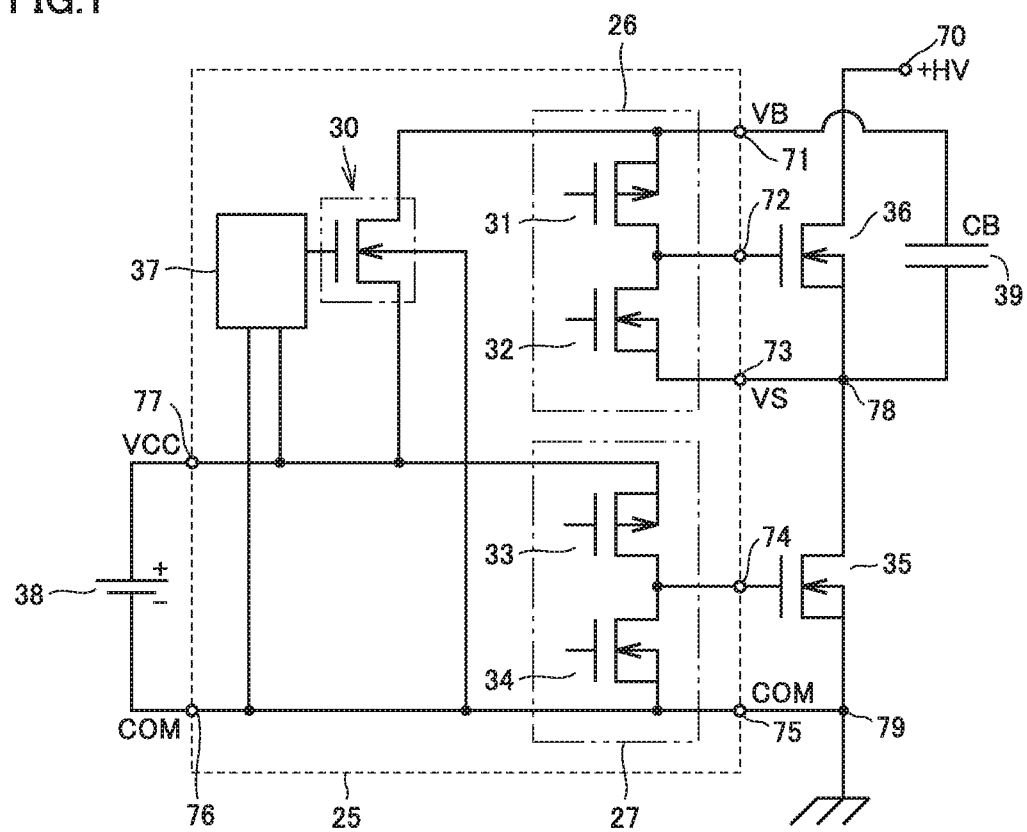
FIG. 1 is a circuit diagram illustrating a bootstrap charging system in a semiconductor device according to a first embodiment.

Hereinafter, embodiments of the present disclosure will be described. It should be noted that the same or corresponding components are denoted by the same reference numerals, and the description thereof will not be repeated.

First Embodiment

<Configuration of Semiconductor Device>

Figure 2:
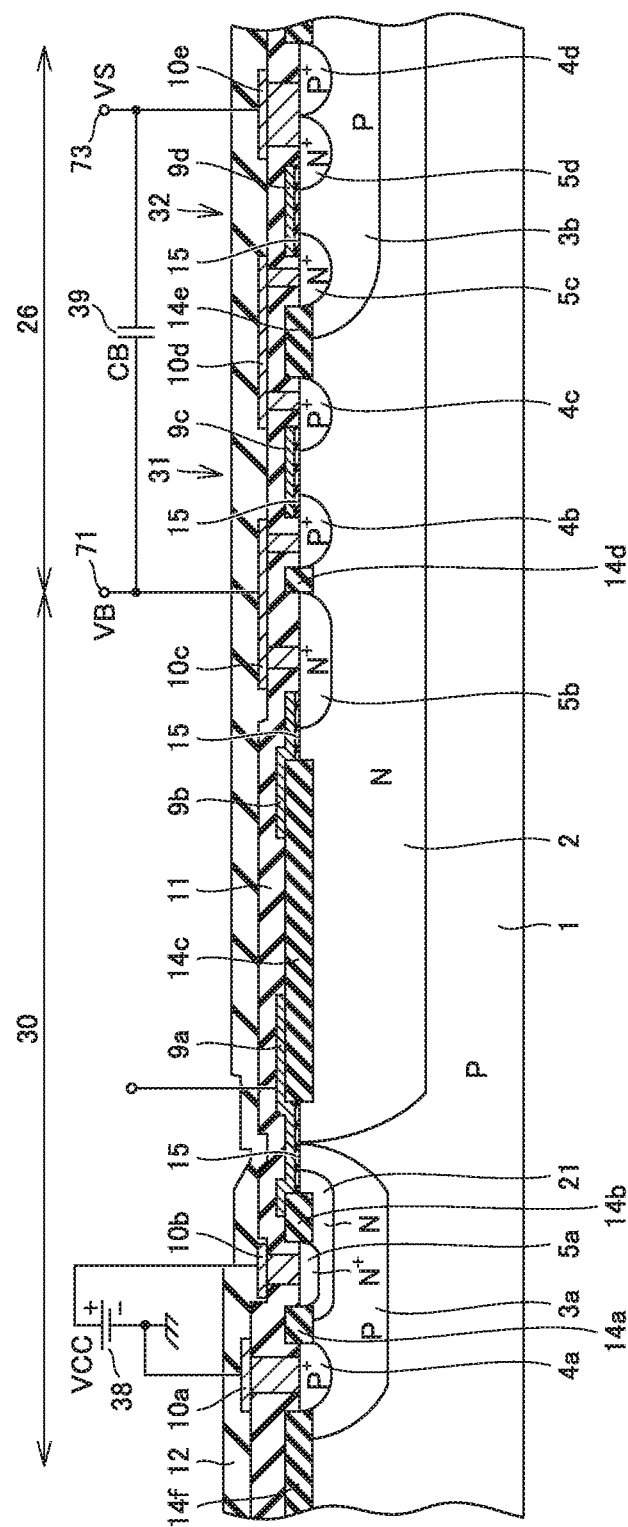
FIG. 2 is a schematic cross-sectional view illustrating a part of the semiconductor device illustrated in FIG. 1.

FIG. 1 is a circuit diagram illustrating a bootstrap charging system in a semiconductor device according to a first embodiment, and FIG. 2 is a schematic cross-sectional view illustrating a part of the semiconductor device illustrated in FIG. 1. FIG. 2 illustrates a cross-sectional configuration of a region where a high breakdown voltage N-channel MOS transistor 30 (also referred to as NchMOS) is formed and a region where a high potential circuit is formed in the semiconductor device.

The semiconductor device illustrated in FIGS. 1 and 2 is a semiconductor device which mainly includes a high breakdown voltage control IC 25 and a bootstrap capacitor 39, and is configured to control a transistor 36 and a transistor 35. The high breakdown voltage control IC 25 mainly includes a transistor 30 which is a high breakdown voltage NchMOS transistor, a high potential circuit 26, and a low potential circuit 27. The high potential circuit 26 includes a transistor 31 which is a P-channel MOS transistor, and a transistor 32 which is an N-channel MOS transistor. The low potential circuit 27 includes a transistor 33 which is a P-channel MOS transistor, and a transistor 34 which is an N-channel MOS transistor.

The high breakdown voltage control IC 25 includes a first node 71, a second node 72, a third node 73, a fourth node 74, a fifth node 75, a sixth node 76 and a seventh node 77. The first electrode of the bootstrap capacitor 39 is connected to the first node 71 (node VB). The source of the transistor 31 is connected to the first node 71. The drain of the transistor 31 is connected to the drain of the transistor 32 and the second node 72. The source of the transistor 32 is connected to the third node 73 (node VS). The second electrode of the bootstrap capacitor 39 is connected to the third node 73 via the eighth node 78. The gate electrode of the transistor 36, which is a high voltage power semiconductor element, is connected to the second node 72. The drain of the transistor 36 is connected to the high voltage power supply node 70. The source of the transistor 36 is connected to the eighth node 78.

The source of the transistor 33 in the low potential circuit 27 is connected to the seventh node 77 (node VCC). The drain of the transistor 33 is connected to the drain of the transistor 34 and the fourth node 74. The source of the transistor 34 is connected to the fifth node 75 (node COM) and the sixth node 76 (node COM). The gate electrode of the transistor 35, which is a low voltage power semiconductor element, is connected to the fourth node 74. The drain of the transistor 35 is connected to the eighth node 78. The source of the transistor 35 is connected to the fifth node 75 via the ninth node 79. The ninth node 79 is grounded.

The positive electrode of the power supply 38 is connected to the seventh node 77. The negative electrode of the power supply 38 is connected to the sixth node 76. The gate electrode of the transistor 30 is connected to a gate driving circuit 37. The gate driving circuit 37 is connected to the sixth node 76 and the seventh node 77. The source of the transistor 30 is connected to the seventh node 77. The drain of the transistor 30 is connected to the source of the transistor 31 and the first node 71. The back gate electrode of the transistor 30 is grounded via the fifth node 75.

FIG. 2 is a schematic cross-sectional view illustrating the transistor 30 and the high potential circuit 26 of the semiconductor device illustrated in FIG. 1. As illustrated in FIG. 2, the semiconductor device is formed, for example, on a semiconductor layer 1 which is a P-type semiconductor substrate having a first conductivity type. The main surface of the semiconductor layer 1 is formed with an N-type diffusion region 2 of an N conductivity type and a P-type diffusion region 3a of a P conductivity type which are arranged adjacent to each other. The N-type diffusion region 2 functions as a drift layer of the transistor 30 and contributes to electric conduction and breakdown voltage resistance. The main surface of the P-type diffusion region 3a is formed with a $P^+$-type diffusion region 4a and an N-type diffusion layer 21. The $P^+$-type diffusion region 4a and the N-type diffusion layer 21 are separated from each other. An $N^+$-type diffusion region 5a is formed in a part of the surface of the N-type diffusion layer 21. The N-type diffusion layer 21 and the $N^+$-type diffusion region 5a function as a source region for the transistor 30. Isolation insulating films 14f and 14a are formed from a LOCOS oxide film or the like on the main surface of the semiconductor layer 1 and configured to sandwich the $P^+$-type diffusion region 4a therebetween. The isolation insulating film 14a is arranged between the $P^+$-type diffusion region 4a and the $N^+$-type diffusion region 5a. The isolation insulating film 14a and an isolation insulating film 14b are formed to sandwich the $N^+$-type diffusion region 5a therebetween. The isolation insulating film 14b is disposed in the N-type diffusion layer 21 at a position separated from an edge of the N-type diffusion region 2.

An insulating film 15 is formed as a gate insulating film for the transistor 30 on the surface of the N-type diffusion layer 21, the P-type diffusion region 3a and the N-type diffusion region 2 at the other side of the isolation insulating film 14b relative to the $N^+$-type diffusion region 5a. An isolation insulating film 14c is formed on the surface of the N-type diffusion region 2 at the other side of the insulating film 15 relative to the isolation insulating film 14b. A gate electrode 9a of the transistor 30 is formed on the insulating film 15. The gate electrode 9a extends from the insulating film 15 to both the isolation insulating film 14b and the isolation insulating film 14c. A back gate electrode 10a of the transistor 30 is connected to the $P^+$-type diffusion region 4a. A source electrode 10b of the transistor 30 is connected to the $N^+$-type diffusion region 5a. The source electrode 10b is connected to the positive electrode of the power supply 38. The back gate electrode 10a is grounded.

An $N^+$-type diffusion region 5b is formed on the surface of the N-type diffusion region 2 at the other side of the isolation insulating film 14c relative to the gate electrode 9a. The $N^+$-type diffusion region 5b is separated from the isolation insulating film 14c. An insulating film 15 is formed on the surface of the N-type diffusion region 2, extending from the isolation insulating film 14c to a position on the surface of the $N^+$-type diffusion region 5b. A polysilicon electrode 9b is formed to extend from the insulating film 15 to a position on the surface of the isolation insulating film 14c. The polysilicon electrode 9b functions as a field plate.

The $N^+$-type diffusion region 5b is connected by a drain electrode 10c of the transistor 30. The drain electrode 10c is connected to the first node 71 and the first electrode of the bootstrap capacitor 39.

The high potential circuit 26 is formed with a P-type diffusion region 3b on the surface of the N-type diffusion region 2. The transistor 31 is formed on the surface of the N-type diffusion region 2, and the transistor 32 is formed on the surface of the P-type diffusion region 3b. Specifically, a P$^+$-type diffusion region 4b and a P$^+$-type diffusion region 4c are formed on the surface of the N-type diffusion region 2. The P$^+$-type diffusion region 4b is arranged to face the N$^+$-type diffusion region 5b with the isolation insulating film 14d interposed therebetween. The P$^+$-type diffusion region 4b is a source region for the transistor 31. The P$^+$-type diffusion region 4c is separated from the P$^+$-type diffusion region 4b. The P$^+$-type diffusion region 4c is a drain region for the transistor 31. The region between the P$^+$-type diffusion region 4b and the P$^+$-type diffusion region 4c forms a channel region for the transistor 31. An insulating film 15 is formed on the surface of the N-type diffusion region 2, extending from the P$^+$-type diffusion region 4b to the P$^+$-type diffusion region 4c. The insulating film 15 located between the P$^+$-type diffusion region 4b and the P$^+$-type diffusion region 4c functions as a gate insulating film of the transistor 31. A gate electrode 9c of the transistor 31 is formed on the insulating film 15.

An N$^+$-type diffusion region 5c and an N$^+$-type diffusion region 5d are formed on the surface of the P-type diffusion region 3b. The N$^+$-type diffusion region 5c is arranged to face the P$^+$-type diffusion region 4c with the isolation insulating film 14e interposed therebetween. The N$^+$-type diffusion region 5c is a drain region for the transistor 32. The N$^+$-type diffusion region 5d is separated from the N$^+$-type diffusion region 5c. The N$^+$-type diffusion region 5d is a source region for the transistor 32. The region between the N$^+$-type diffusion region 5c and the N$^+$-type diffusion region 5d serves as a channel region for the transistor 32. An insulating film 15 is formed on the surface of the P-type diffusion region 3b, extending from the N$^+$-type diffusion region 5c to the N$^+$-type diffusion region 5d. The insulating film 15 located between the N$^+$-type diffusion region 5c and the N$^+$-type diffusion region 5d functions as a gate insulating film of the transistor 32. A gate electrode 9d of the transistor 32 is formed on the insulating film 15. A P-type diffusion region 4d is formed on the surface of the P-type diffusion region 3b, and is arranged adjacent to the N$^+$-type diffusion region 5d.

The drain electrode 10c of the transistor 30 is electrically connected to the N$^+$-type diffusion region 4b of the transistor 31. The P$^+$-type diffusion region 4c, which is the drain region for the transistor 31, is connected to the N$^+$-type diffusion region 5c of the transistor 31 via the electrode 10d. An electrode 10e is formed to connect the N$^+$-type diffusion region 5d and the P-type diffusion region 4d. The electrode 10e is electrically connected to the third node 73 and the second electrode of the bootstrap capacitor 39.

An interlayer insulating film 11 is formed so as to cover the gate electrodes 9a, 9c and 9d and the polysilicon electrode 9b. A part of the back gate electrode 10a, the source electrode 10b, the drain electrode 10c, the electrodes 10d and 10e extend on the upper surface of the interlayer insulating film 11. A passivation film 12 is formed on the interlayer insulating film 11.

In the semiconductor device mentioned above, the N-type diffusion layer 21 is configured to form a part of the source region for the transistor 30, and withstand a breakdown voltage equal to or greater than the power supply voltage with respect to the P$^+$-type diffusion region 4a as the back gate layer. The breakdown voltage may be arbitrarily adjusted by changing the impurity concentration in the N-type diffusion layer 21, the size of the N-type diffusion layer 21, or the like.

Each of the back gate electrode 10a, the source electrode 10b, the drain electrode 10c, and the electrodes 10d and 10e may be made of any conductive material such as any metal. For example, each electrode may be made of aluminum (Al). The gate electrodes 9a, 9c, and 9d may be made of silicon, for example.

The N-type diffusion region 2 also functions as a well for electrically isolating the high potential circuit 26 from the semiconductor layer 1. However, the high potential circuit 26 may be electrically isolated by any other means. For example, the high potential circuit 26 may be electrically isolated from the semiconductor layer 1 by introducing a buried diffusion layer directly below the high potential circuit 26. In addition, the P-type diffusion region 3a may be used as a back gate of the transistor 30. As illustrated in FIG. 2, the drain region for the transistor 30 is preferably formed contiguously with the N-type diffusion region 2 where the high potential circuit 26 is formed, which makes it possible to reduce the footprint of the semiconductor device. If there is no influence on the breakdown voltage of the semiconductor device, a buried diffusion layer may be introduced so as to electrically connect the N-type diffusion region 2 where the high potential circuit 26 is formed and the drain region for the transistor 30.

<Effect of Semiconductor Device>

The semiconductor device according to the present disclosure is a semiconductor device that supplies a charging current to a bootstrap capacitor 39 which serves as a target element to be charged, and includes, for example, a semiconductor layer 1 of a first conductivity type (P-type) as a P-type substrate, an N$^+$-type diffusion region 5b and an N-type diffusion region 2 as a first semiconductor region of a second conductivity type (N-type), a N$^+$-type diffusion region 4a and a P-type diffusion region 3a as a second semiconductor region of the first conductivity type, an N$^+$-type diffusion region 5a as a third semiconductor region of the second conductivity type, a source electrode 10b, a drain electrode 10c, a back gate electrode 10a, and a gate electrode 9a. The first semiconductor region (the N$^+$-type diffusion region 5b and the N-type diffusion region 2) is electrically connected to the first electrode of the bootstrap capacitor 39. The first semiconductor region (the N$^+$-type diffusion region 5b and the N-type diffusion region 2) is formed on the main surface of the semiconductor layer 1. The second semiconductor region (the N$^+$-type diffusion region 4a and the P-type diffusion region 3a) is formed on the main surface of the semiconductor layer 1 at a position adjacent to the first semiconductor region (the N-type diffusion region 2). The N$^+$-type diffusion region 5a as the third semiconductor region is supplied with a power supply voltage (Vcc). The N$^+$-type diffusion region 5a is formed on the surface of the second semiconductor region (the N$^+$-type diffusion region 4a and the P-type diffusion region 3a). The source electrode 10b is connected to the third semiconductor region (the N$^+$-type diffusion region 5a) and is supplied with the power supply voltage. The drain electrode 10c is connected to the first semiconductor region (the N$^+$-type diffusion region 5b and the N-type diffusion region 2) and is electrically connected to the first electrode of the bootstrap capacitor 39. The back gate electrode 10a is connected to a region in the second semiconductor region (the P$^+$-type diffusion region 4a and the P-type diffusion region 3a) separated from the third semiconductor region (the N$^+$-type diffusion region 5a) and is grounded. The gate electrode 9a is formed as a gate insulating film in the second semiconductor region (the P$^+$-type diffusion region 4a and the P-type diffusion region 3a) and arranged to face a channel region located between the third semiconductor region (the N⁺-type diffusion region 5a) and the first semiconductor region (the N⁺-type diffusion region 5b and the N-type diffusion region 2) via the insulating film 15. The breakdown voltage between the source electrode 10b and the back gate electrode 10a is greater than the power supply voltage.

With the above configuration, since a voltage greater than the power supply voltage (Vcc) may be applied to the source electrode 10b and the back gate electrode 10a may be fixed at the ground potential, the bootstrap capacitor 39 may be charged without providing an additional circuit for controlling the potential of the source electrode and the potential of the back gate electrode as in the related art. In other words, the charging operation may be performed on the bootstrap capacitor 39 by fixing the potential of the source electrode 10b and the potential of the back gate electrode 10a and controlling only the voltage of the gate electrode 9a. As a result, it is possible to simplify the configuration of the circuit required for charging the bootstrap capacitor 39, which makes it possible to reduce the manufacturing cost of the semiconductor device.

The semiconductor device includes an N-type diffusion layer 21 as the fourth semiconductor region of the second conductivity type. The fourth semiconductor region (the N-type diffusion layer 21) is formed in the second semiconductor region (the P⁺-type diffusion region 4a and the P-type diffusion region 3a) and arranged to surround the periphery of the third semiconductor region (the N⁺-type diffusion region 5a) and isolate the third semiconductor region (the N⁺-type diffusion region 5a) from the second semiconductor region (the N⁺-type diffusion region 4a and the P-type diffusion region 3a). The N-type diffusion layer 21 extends in the second semiconductor region (the P⁺-type diffusion region 4a and the P-type diffusion region 3a) from the periphery of the N⁺-type diffusion region 5a to a region which is opposed to the first semiconductor region (the N⁺-type diffusion region 5b and the N-type diffusion region 2) and separated from the first semiconductor region (the N⁺-type diffusion region 5b and the N-type diffusion region 2). The channel region is arranged in the second semiconductor region (the P⁺-type diffusion region 4a and the P-type diffusion region 3a) between the N-type diffusion layer 21 and the first semiconductor region (the N⁺-type diffusion region 5b and the N-type diffusion region 2).

Thus, the formation of the N-type diffusion layer 21 makes the breakdown voltage between the source electrode 10b and the back gate electrode 10a greater than the power supply voltage. With such a configuration, it is possible for the semiconductor device to perform the charging operation on the bootstrap capacitor 39 as described above.

The semiconductor device may have a breakdown voltage of 300 V or more. In the present disclosure, the breakdown voltage refers to a maximum voltage that may be applied between the drain electrode 10c and the source electrode 10b.

Thus, the semiconductor device according to the present disclosure may be used as a high breakdown voltage semiconductor for performing gate driving of a power semiconductor that controls a high voltage power source such as a power source of an electric motor or the like.

Figure 3:
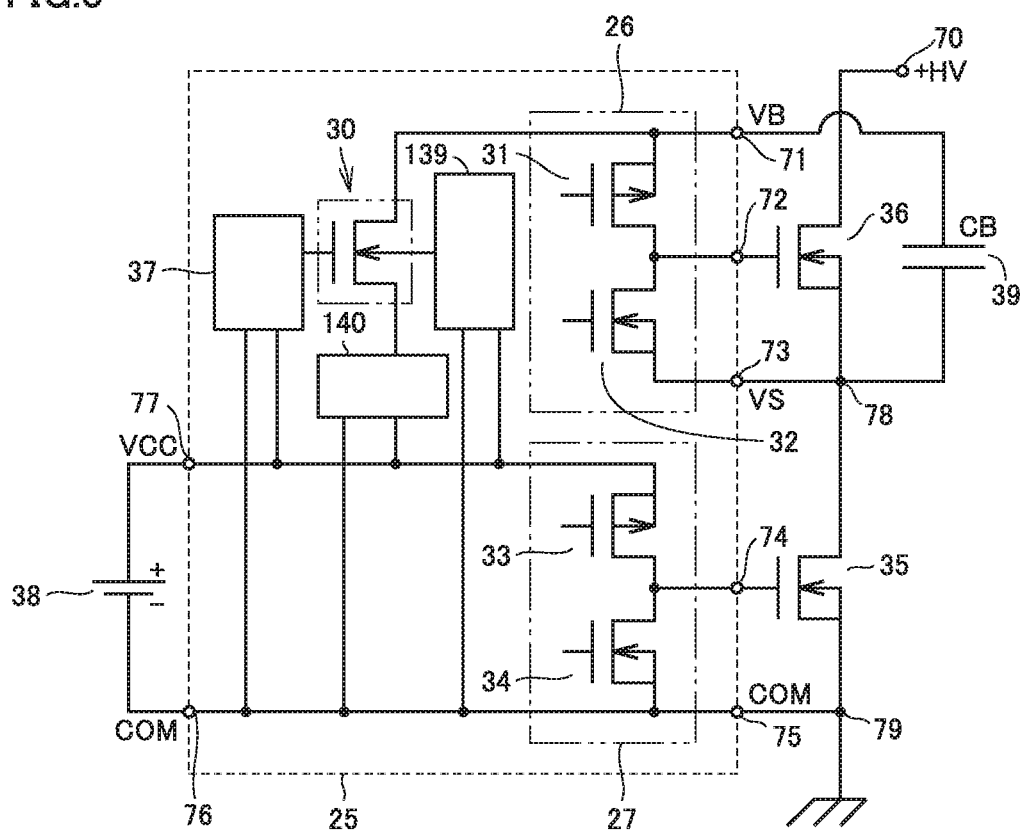
FIG. 3 is a circuit diagram illustrating a bootstrap charging system in a semiconductor device according to a comparative example.
Figure 4:
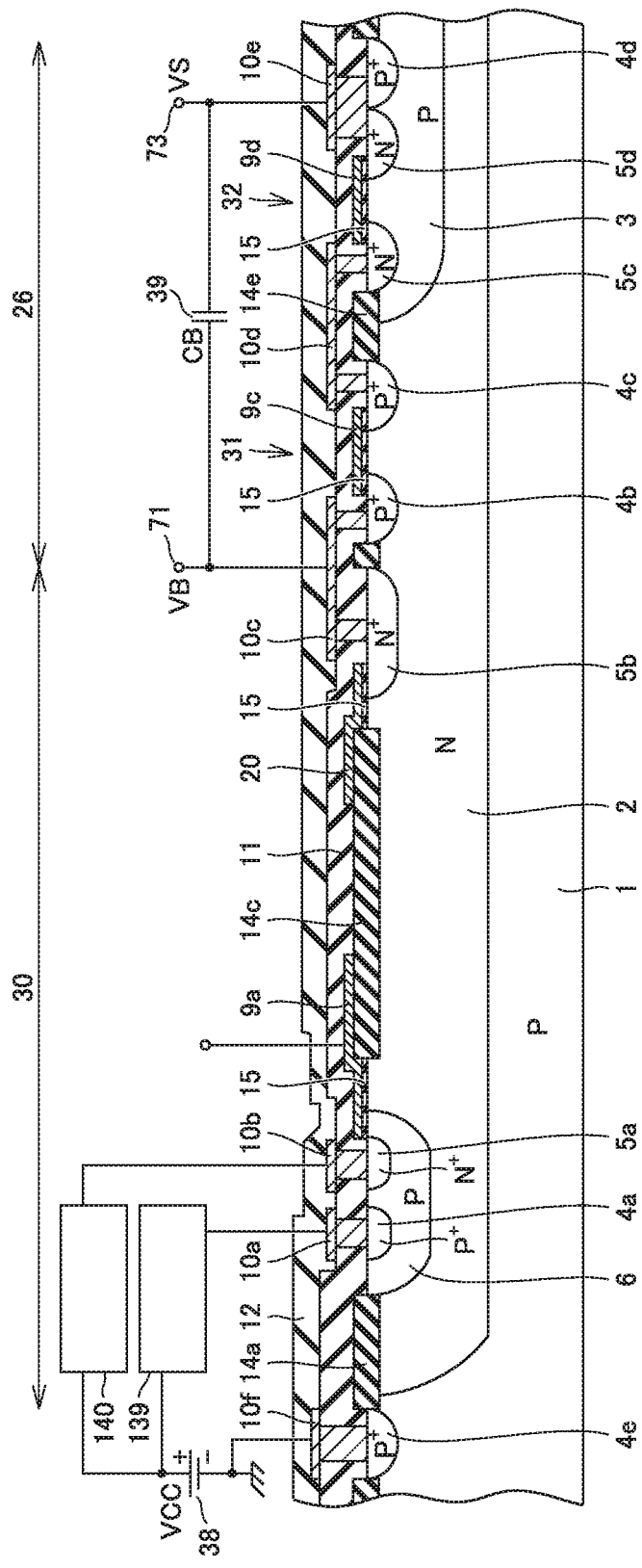
FIG. 4 is a schematic cross-sectional view illustrating a part of the semiconductor device illustrated in FIG. 3 according to the comparative example.

The Effect of the semiconductor device according to the present embodiment will be described in more detail in comparison with a semiconductor device according to a comparative example. FIG. 3 is a circuit diagram illustrating a bootstrap charging system in a semiconductor device according to a comparative example, and FIG. 4 is a schematic cross-sectional view illustrating a part of the semiconductor device illustrated in FIG. 3 according to the comparative example.

The semiconductor device illustrated in FIG. 3 according to the comparative example basically has the same circuit configuration as that of the semiconductor device according to the present embodiment illustrated in FIG. 1 except that a source potential control circuit 140 is connected to the source electrode of the transistor 30 which serves as a high breakdown voltage MOS transistor and a back gate potential control circuit 139 is connected to the back gate electrode of the transistor 30. FIG. 4 is a schematic cross-sectional view of the transistor 30 and the high potential circuit 26 in the semiconductor device illustrated in FIG. 3. The semiconductor device according to the comparative example illustrated in FIG. 4 basically has the same configuration as the semiconductor device according to the present embodiment illustrated in FIG. 2 except that the configuration of the transistor 30 is different from that in the semiconductor device illustrated in FIG. 2. Specifically, in the semiconductor device illustrated in FIG. 4, a P-type diffusion region 6 is formed inside the N-type diffusion region 2. A P⁺-type diffusion region 4a and an N⁺-type diffusion region 5a are formed on the surface of the P-type diffusion region 6 and separated from each other. A P⁺-type diffusion region 4e is formed on the main surface of the semiconductor layer 1 and separated from the P-type diffusion region 6 with the isolation insulating film 14a interposed therebetween. A back gate electrode 10a is connected to the P⁺-type diffusion region 4a. A source electrode 10b is connected to the N⁺-type diffusion region 5a. An electrode 10f is connected to the P⁺-type diffusion region 4e. As described above, the back gate potential control circuit 139 is connected to the back gate electrode 10a, and the source potential control circuit 140 is connected to the source electrode 10b. The electrode 10f is grounded.

In the semiconductor device according to the comparative example as described above, in order to prevent the accidental operation of the transistor 30 and suppress the operation of the parasitic bipolar element, the back gate potential control circuit 139 and the source potential control circuit 140 are provided, which makes the circuit configuration of the semiconductor device according to the comparative example complicated, leading to an increase in the manufacturing cost.

On the contrary, the semiconductor device according to the present embodiment is formed with the N-type diffusion layer 21 so that a voltage sufficiently greater than the power supply voltage (Vcc) may be applied to the N⁺-type diffusion region 5a which serves as the source region. In addition, the back gate electrode 10a is grounded. Therefore, it is possible for the semiconductor device according to the present embodiment to prevent the parasitic bipolar element from operating with a simple circuit configuration, without the need of providing the back gate potential control circuit 139 and the source potential control circuit 140 as in the comparative example.

When the transistor 30 is used to charge the bootstrap capacitor 39, the high potential circuit 26 transitions to a low potential when the output of the high potential circuit 26 is LOW and the transistor 36 which serves as a switch element is in an off state, the output of the low potential circuit 27 is high and the transistor 35 which serves as a switch element is in an on state. In this state, the bootstrap capacitor 39 may be charged by the transistor 30 which is a high breakdown voltage NchMOS transistor. The charging period is determined by an output command to each of the high potential circuit 26 and the low potential circuit 27 in the charging system. Therefore, the charging period may be logically determined by the system. The logically determined charging period may be sent to the gate driving circuit 37 of the transistor 30 to control the gate of the transistor 30 at an optimal timing so as to charge the bootstrap capacitor 39.

Further, according to the semiconductor device of the present embodiment, since the back gate electrode 10a of the transistor 30 is grounded, as illustrated in FIG. 2, the P-type diffusion region 3a that constitutes the back gate may be formed in contact with the semiconductor layer 1, without including the N-type diffusion region 2 that constitutes the drain layer of the transistor 30, whereby the parasitic PNP transistor that is composed of the back gate, the drain and the semiconductor layer 1 as in the semiconductor device according to the comparative example may be eliminated.

Regarding the parasitic NPN transistor composed of the source, the back gate and the drain, in the semiconductor device according to the present embodiment, the source and the back gate are constantly and reversely biased by the power supply voltage (Vcc). Therefore, the parasitic operation in the state where the source of the transistor 30 becomes the emitter of the NPN transistor (in other words, the drain of the transistor 30 is in a high potential state and functions as the collector) may be sufficiently suppressed. As a result, it is possible to prevent the semiconductor device from being damaged by the parasitic operation. Note that the parasitic operation in the reverse direction, in other words, the parasitic operation in a state where the drain of the transistor 30 functions as the emitter of the NPN transistor contributes to the charging operation on the bootstrap capacitor 39, and thereby will cause no problem. When the potential of the drain electrode of the transistor 30 becomes equal to or greater than the power supply voltage (Vcc), the charging operation is automatically terminated.

As described above, according to the semiconductor device of the present embodiment, it is possible to simplify the configuration of the system while eliminating the formation of the parasitic bipolar transistor and suppressing the parasitic operation, which makes it possible to reduce the manufacturing cost and improve the reliability (robustness) of the semiconductor device.

Second Embodiment

<Configuration of Semiconductor Device>

Figure 5:
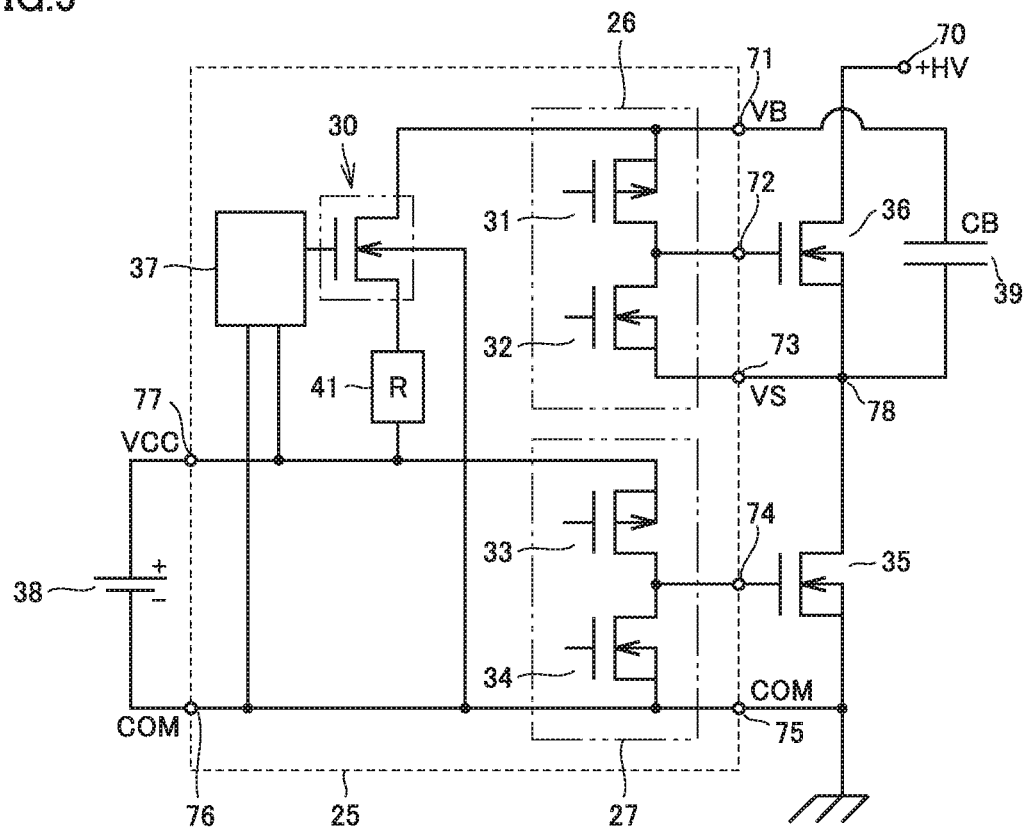
FIG. 5 is a circuit diagram illustrating a bootstrap charging system in a semiconductor device according to a second embodiment.
Figure 6:
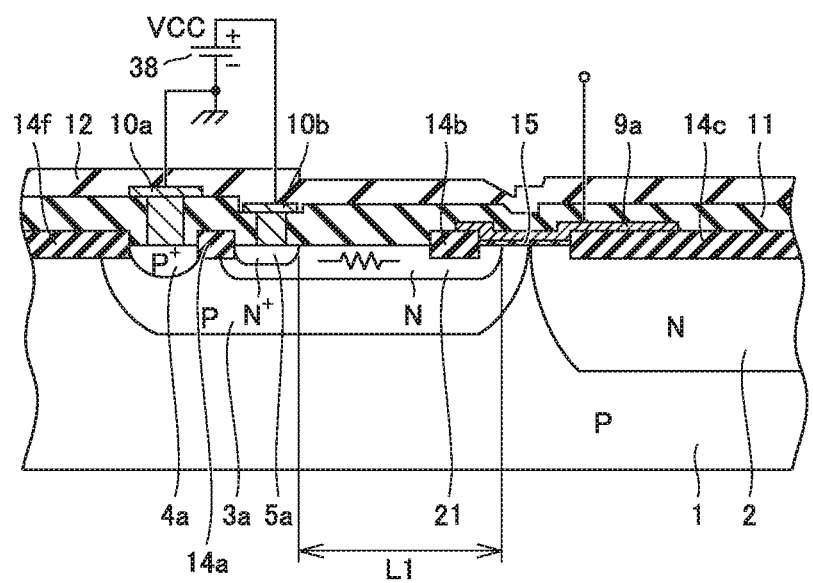
FIG. 6 is a schematic cross-sectional view illustrating a part of the semiconductor device illustrated in FIG. 5.

FIG. 5 is a circuit diagram illustrating a bootstrap charging system in a semiconductor device according to a second embodiment, and FIG. 6 is a schematic cross-sectional view illustrating a part of the semiconductor device illustrated in FIG. 5. FIG. 6 illustrates a schematic cross-sectional view of a part of the transistor 30 in the semiconductor device.

The semiconductor device illustrated in FIGS. 5 and 6 basically has the same configuration as the semiconductor device illustrated in FIGS. 1 and 2, but differs from the semiconductor device illustrated in FIGS. 1 and 2 in that a limit resistor 41 is connected to the source of the transistor 30.

As illustrated in FIG. 5, the source of the transistor 30 is connected to the seventh node 77 via the limit resistor 41. The limit resistor 41 may be configured in various manners. For example, as illustrated in FIG. 6, the planar shape of the N-type diffusion layer 21 may be modified so as to relatively increase a distance L1 between the N$^+$-type diffusion region 5a and the channel region below the gate electrode 9a. As a result, the N-type diffusion layer 21 located between the N$^+$-type diffusion region 5a to which the source electrode 10b is connected and the channel region below the gate electrode 9a functions as the limit resistor. The resistance value of the limit resistor may be adjusted by changing the impurity concentration of the N-type diffusion layer 21 and the shape of the N-type diffusion layer 21. The limit resistor has an effect of preventing the bootstrap capacitor 39 or any other elements in the semiconductor device from being damaged by a rush current that flows from the source to the drain of the transistor 30 when the parasitic NPN transistor is operating in the semiconductor device.

<Effect of Semiconductor Device>

The semiconductor device according to the present embodiment may further include a limit resistor 41. The limit resistor 41 is arranged on a current path from the power supply 38, which supplies the power supply voltage (Vcc), to the channel region.

Thus, the inclusion of the limit resistor 41 makes it possible to reduce the possibility that the bootstrap capacitor 39 or the like is damaged by the rush current that flows from the source electrode 10b to the drain electrode 10c when the parasitic NPN transistor is operating in the semiconductor device.

In the semiconductor device according to the present embodiment, the limit resistor 41 may be a portion of the N-type diffusion layer 21 which serves as the fourth semiconductor region and is located between the N$^+$-type diffusion region 5a which serves as the third semiconductor region and the channel region. Thus, the resistance value of the limit resistor 41 may be easily adjusted by changing the impurity concentration and the shape of the N-type diffusion layer 21.

Generally in the driving circuit of a power stage to which the semiconductor device according to the present embodiment is applied, a large current is supplied to a load having a large inductance such as an electric motor. Therefore, the potential of the third node 73 (VS), which is an intermediate connection point between the switch elements, may be affected by the surge of the inductance and become a negative potential. If the voltage of the third node 73 becomes a negative voltage equal to or less than (the potential (VB) of the first node 71–the potential (VS) of the third node)), the voltage of the first node 71 is also biased to a negative voltage. As a result, the drain of the transistor 30 becomes a negative potential, which induces the parasitic NPN transistor into operation.

Specifically, the drain of the transistor 30 functions as an emitter, and the semiconductor layer 1 and the back gate of the transistor 30 are forward biased toward the drain to inject holes into the drain (the emitter), thereby functioning as a base. The source functions as a collector of the parasitic NPN transistor to inject electrons into the emitter (the drain). Since the bipolar transistor basically operates at a low impedance, a rush current is generated to flow from the source to the drain of the transistor 30, which may damage the constituent elements in the semiconductor device such as the bootstrap capacitor 39. However, by providing the N-type diffusion layer 21 as illustrated in FIGS. 5 and 6, it is possible to impart an appropriate electrical resistance to the source of the transistor 30. As a result, when the parasitic NPN transistor is in operation, the N-type diffusion layer 21 may function as a limit resistor.

Third Embodiment

<Configuration of Semiconductor Device>

Figure 7:
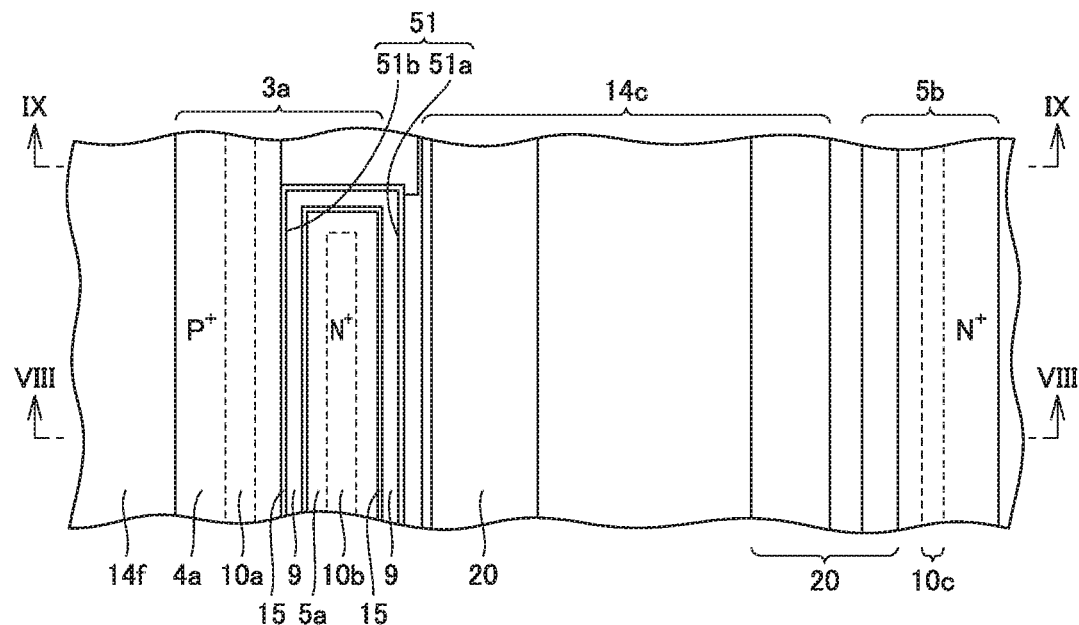
FIG. 7 is a schematic plan view illustrating a part of a semiconductor device according to a third embodiment.
Figure 8:
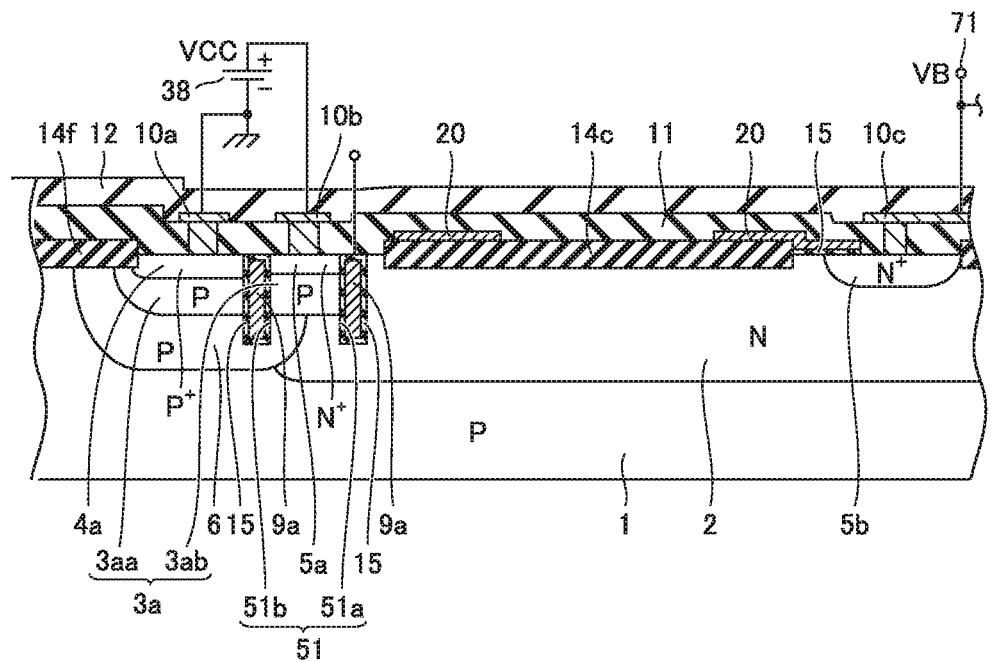
FIG. 8 is a schematic sectional view taken along line VIII-VIII in FIG. 7.
Figure 9:
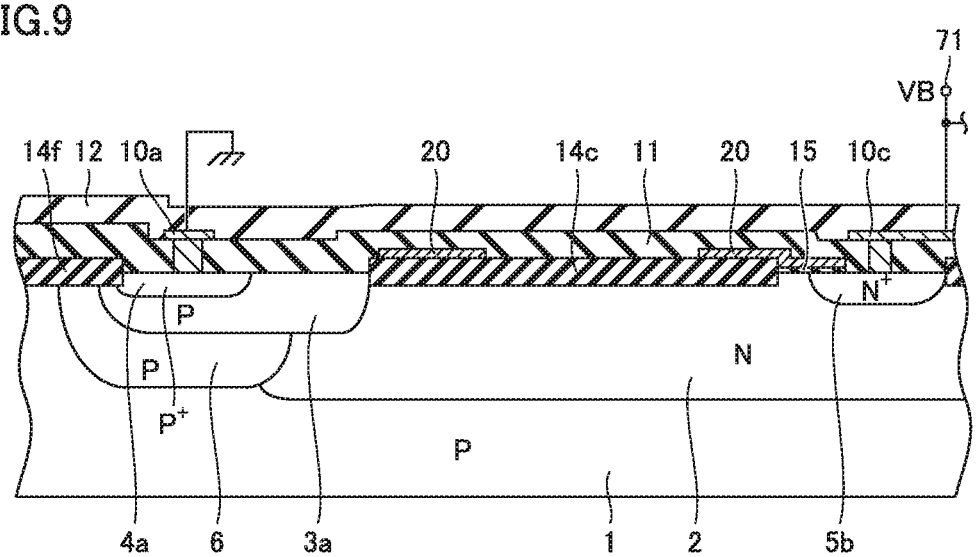
FIG. 9 is a schematic sectional view taken along line IX-IX in FIG. 7.

FIG. 7 is a schematic plan view illustrating a part of a semiconductor device according to a third embodiment, FIG. 8 is a schematic sectional view taken along line VIII-VIII in FIG. 7, and FIG. 9 is a schematic sectional view taken along line IX-IX in FIG. 7. The semiconductor device illustrated in FIGS. 7 to 9 basically has the same configuration as the semiconductor device illustrated in FIGS. 1 and 2, but differs in the configuration of the gate of the transistor 30 and the structure for withstanding the breakdown voltage between the source and the back gate.

In other words, in the semiconductor device illustrated in FIGS. 7 to 9, the transistor 30 has a trench gate structure. Specifically, a trench 51 is formed to surround the N⁺-type diffusion region 5a which serves as the source region for the transistor 30. The P-type diffusion region 3a includes a first region 3aa located outside the trench 51 and a second region 3ab located inside the trench 51. The second region 3ab is arranged inside the trench 51 so as to be in contact with the bottom surface of the N⁺-type diffusion region 5a. The first region 3aa is arranged to be in contact with the bottom surface of the P⁺-type diffusion region 4a. The P-type diffusion region 6 extends across the bottom surface of the first region 3aa to a position on the bottom surface of the second region 3ab inside the trench 51. The N-type diffusion region 2 extends inside the trench 51 across a part 51a of the trench 51. The P-type diffusion region 6 that extends inside the trench 51 across the other part 51b of the trench 51 is in contact with the N-type diffusion region 2 inside the trench 51. In order to ground the second region 3ab of the P-type diffusion region 3a, the P-type diffusion region 6 is in contact with the second region 3ab inside the trench 51. The N-type diffusion region 2 is in contact with the second region 3ab of the P-type diffusion region 3a inside the trench 51. An insulating film 15 is formed on the inner wall of the trench 51 as a gate insulating film. A gate electrode 9a is formed on the insulating film 15. A region in the second region 3ab that faces the part 51a of the trench 51 serves as the channel region for the transistor 30. The gate electrode 9a is formed to fill the inside of the trench 51. The trench 51 extends from the main surface of the semiconductor layer 1 to a position in the P-type diffusion region 6 or the N-type diffusion region 2 that is further than the bottom surface of the second region 3ab.

A field plate 20 made of a conductive film is arranged on the isolation insulating film 14c at a position closer to the trench 51 and a position further away from the trench 51, respectively.

<Effect of Semiconductor Device>

In the semiconductor device according to the present embodiment, the main surface of the semiconductor layer 1 is formed with a trench 51. The part 51a of the trench 51 partitions the channel region and the first semiconductor region (the N⁺-type diffusion region 5b and the N-type diffusion region 2). The insulating film 15, which serves as a gate insulating film, is formed on the inner wall surface of the part 51a of the trench that faces the channel region. The gate electrode 9a is formed inside the trench 51. The trench 51 extends from the main surface of the semiconductor layer 1 to a position further than the bottom surface of the second semiconductor region (the P⁺-type diffusion region 4a and the P-type diffusion region 3a). The other part 51b of the trench 51 is formed in a region between the back gate electrode 10a and the source electrode 10b. The second semiconductor region (the P-type diffusion region 3a) includes a first region 3aa and a second region 3ab. The first region 3aa is located closer to the back gate electrode 10a than the other part 51b of the trench 51. The second region 3ab is located closer to the source electrode 10b than the other part 51b of the trench 51 and includes a channel region.

The first semiconductor region (the N-type diffusion region 2) extends across a region located below the part 51a of the trench 51 so as to be in contact with the channel region. The semiconductor device further includes an extending region (P-type diffusion region 6) of the first conductivity type (P-type). The P-type diffusion region 6 is formed in the semiconductor layer 1 as an extending region so as to be in contact with the first region 3aa and the second region 3ab. The P-type diffusion region 6 extends from the bottom surface of the first region 3aa across a region located below the other part 51b of the trench 51 to the bottom surface of the second region 3ab.

Thus, the adoption of a so-called trench gate structure using the trench 51 makes it possible to improve the breakdown voltage between the source electrode 10b and the back gate electrode 10a, which makes it possible to make the breakdown voltage between the source electrode 10b and the back gate electrode 10a greater than the power supply voltage (Vcc).

In the semiconductor device, the trench 51 may be formed on the main surface of the semiconductor layer 1 and arranged to surround the third semiconductor region (the N⁺-type diffusion region 5a). Therefore, the N⁺-type diffusion region 5a to which the source electrode 10b is connected may be separated from the surrounding region, which makes it possible to arrange an element that functions differently from the bootstrap circuit in the region where the high breakdown voltage NchMOS transistor 30 is formed.

In the structure of the semiconductor device described in the first embodiment, an N-type diffusion layer 21 is formed so as to improve the breakdown voltage between the source region and the back gate. In this case, in order to prevent the breakdown voltage from decreasing due to the electric field concentration at a corner portion of the N-type diffusion layer 21, it is generally necessary to introduce a deeper diffusion layer or to reduce the concentration of the P-type diffusion region 3a electrically connected to the back gate. These measures may increase the current gain of the parasitic NPN transistor unless the structure is properly designed, which lowers the reliability of the semiconductor device.

Therefore, in the present embodiment, in order to improve the breakdown voltage between the source and the back gate, an N⁺-type diffusion region 5a serving as the source region is formed inside the trench 51 of the trench gate structure. As a result, the corner portion of the N-type diffusion layer 21 as illustrated in FIG. 2 is eliminated, which makes it possible to prevent the breakdown voltage from being reduced by the electric field concentration. Further, as illustrated in FIG. 8, the junction between the source and the back gate is mainly a one-dimensional junction between the lower portion of the N⁺-type diffusion region 5a located inside the trench 51 and the upper portion of the second region 3ab in the P-type diffusion region. Further, the gate electrode 9a inside the trench 51 serves as a field plate to extend the depletion layer, thereby reducing the electric field. Therefore, the breakdown voltage is improved in the region in contact with the trench 51. Therefore, the breakdown voltage between the source and the back gate is not determined by the boundary such as the end portion of the N-type diffusion layer 21 as illustrated in FIG. 2. As a result, it is possible to improve the breakdown voltage of the semiconductor device and make the breakdown voltage stable.

Fourth Embodiment

<Configuration of Semiconductor Device>

Figure 10:
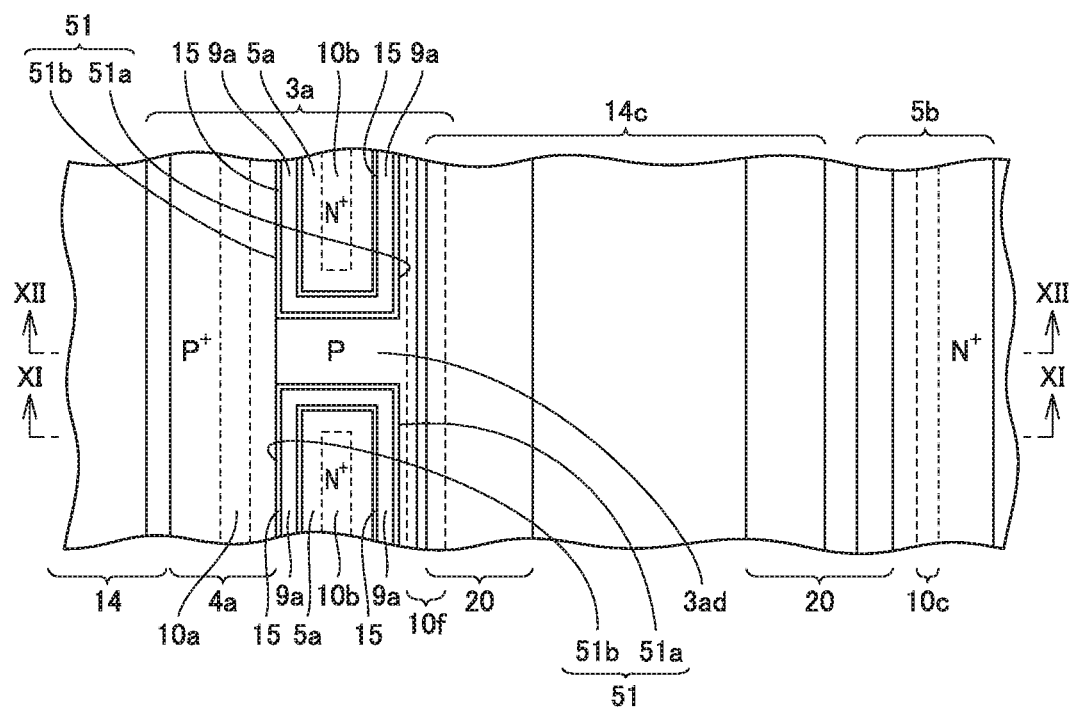
FIG. 10 is a schematic plan view illustrating a part of a semiconductor device according to a fourth embodiment.
Figure 11:
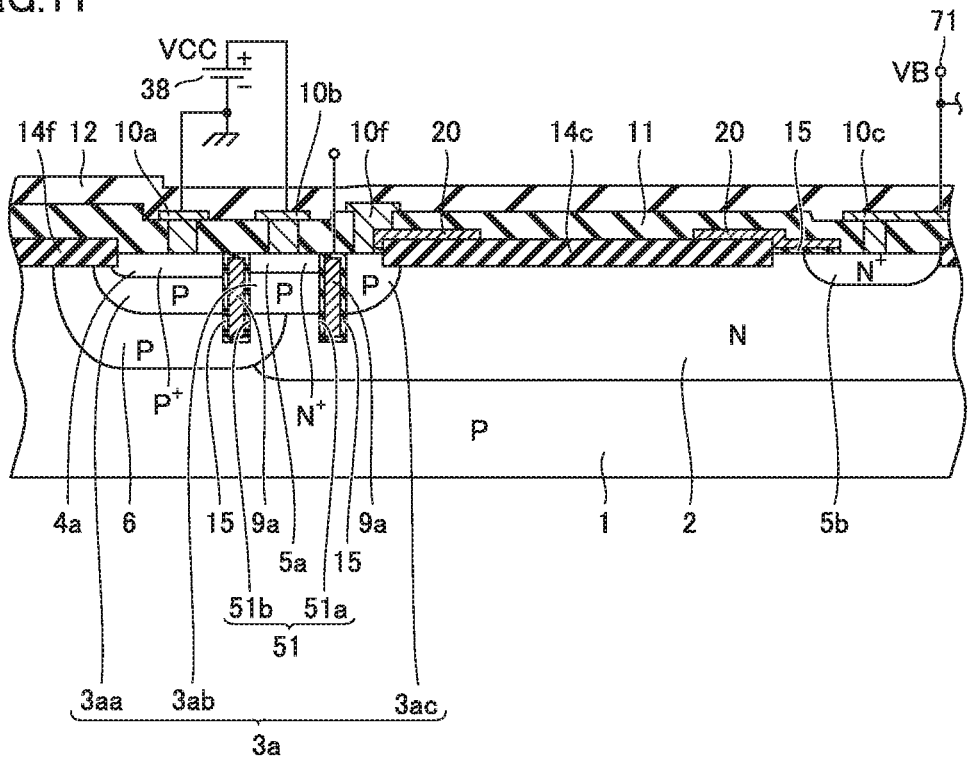
FIG. 11 is a schematic sectional view taken along line XI-XI in FIG. 10.
Figure 12:
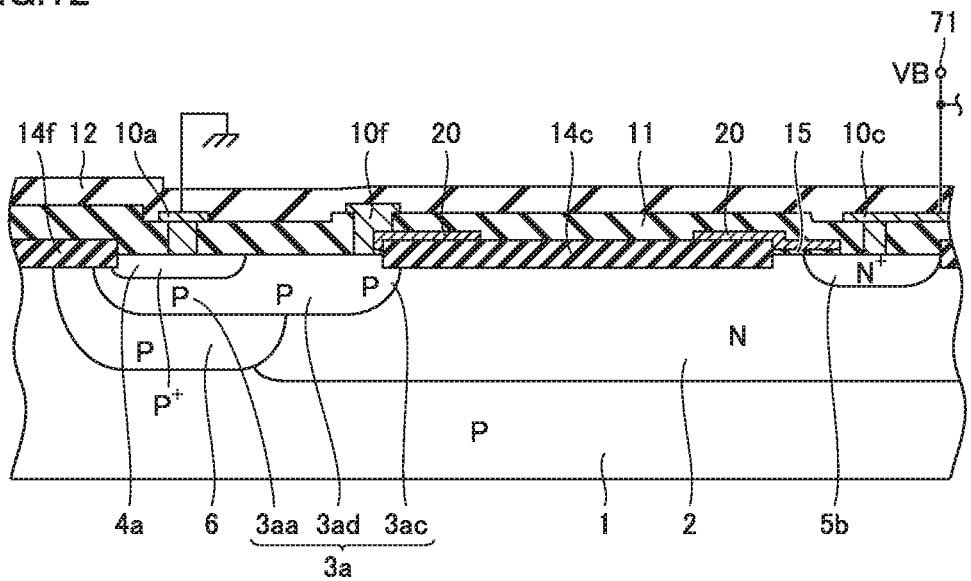
FIG. 12 is a schematic sectional view taken along line XII-XII of FIG. 10.

FIG. 10 is a schematic plan view illustrating a part of a semiconductor device according to a fourth embodiment, FIG. 11 is a schematic sectional view taken along line XI-XI in FIG. 10, and FIG. 12 is a schematic sectional view taken along line XII-XII of FIG. 10. The semiconductor device illustrated in FIGS. 10 to 12 basically has the same configuration as the semiconductor device illustrated in FIGS. 7 to 9 except that the structure of the P-type diffusion region 3a is different from that of the semiconductor device illustrated in FIGS. 7 to 9. In other words, in the semiconductor device illustrated in FIGS. 10 to 12, a part of the P-type diffusion region 3a extends from the trench 51 to the isolation insulating film 14c. The P-type diffusion region 3a includes a first region 3aa located below the $P^+$-type diffusion region 4a, a second region 3ab located below the $N^+$-type diffusion region 5a and inside the trench 51, a third region 3ac extending from the trench 51 to the isolation insulating film 14c, and a fourth region 3ad which is located around the trench 51 and connects the first region 3aa and the third region 3ac. As illustrated in FIG. 10, a plurality of trenches 51 are formed along the boundary between the P-type diffusion region 3a and the N-type diffusion region 2 and separated from each other. The fourth region 3ad is arranged between the plurality of trenches 51. The third region 3ac is in contact with the N-type diffusion region 2. The third region 3ac extends from the surface of the trench 51 to the isolation insulating film 14c.

<Effect of Semiconductor Device>

In the semiconductor device according to the present embodiment, the second semiconductor region (the $P^+$-type diffusion region 4a and the P-type diffusion region 3a) further includes a third region 3ac and a fourth region 3ad. The third region 3ac is located at the other side of the part 51a of the trench 51 relative to the second region 3ab. The fourth region 3ad is located outside the trench 51 and connects the first region 3aa and the third region 3ac.

Since the first region 3aa and the third region 3ac are connected by the fourth region 3ad, as a result the third region 3ac is grounded. Therefore, the depletion of the N-type diffusion region 2 adjacent to the third region 3ac is promoted, which makes it possible to improve the breakdown voltage and the stability of the semiconductor device.

Fifth Embodiment

<Configuration of Semiconductor Device>

Figure 13:
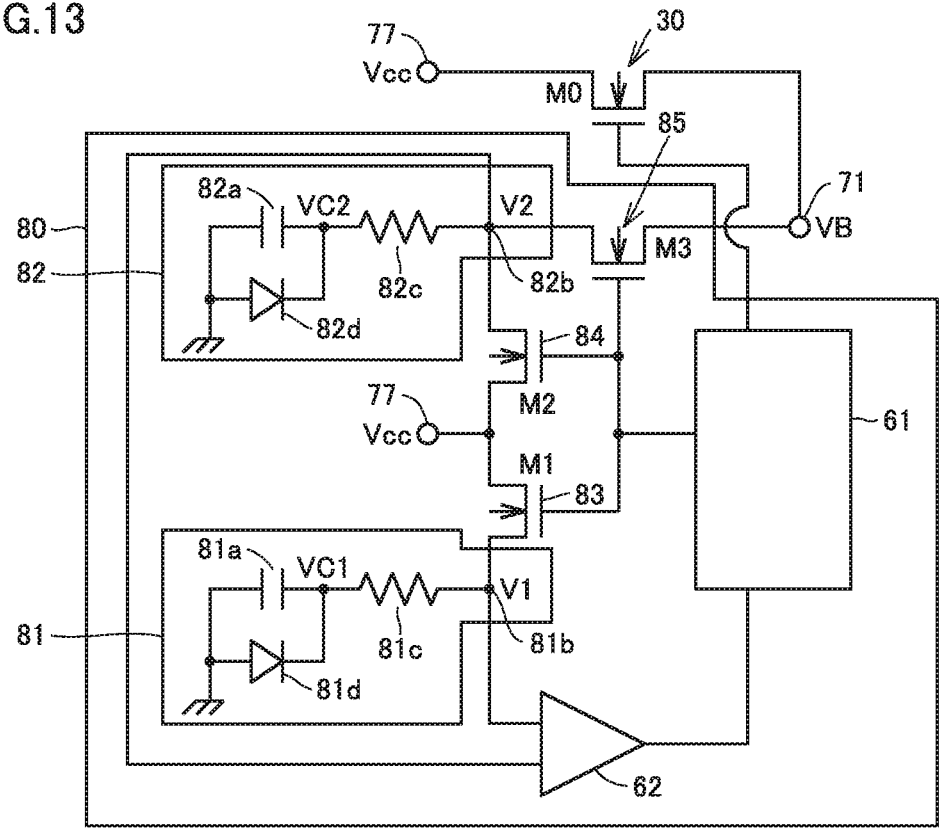
FIG. 13 is a circuit diagram illustrating a potential detection circuit in a semiconductor device according to a fifth embodiment.
Figure 14:
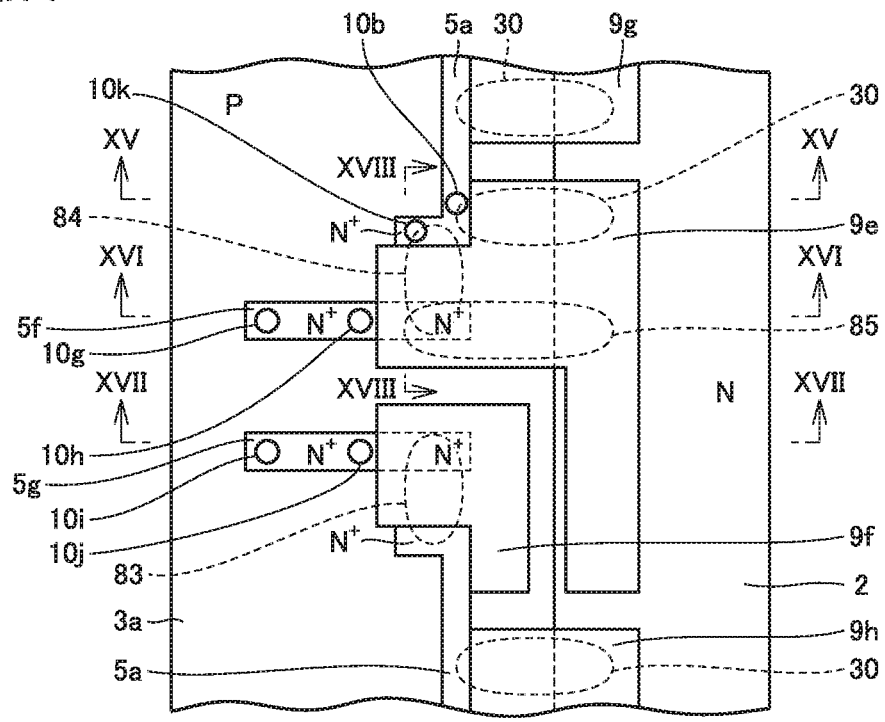
FIG. 14 is a schematic plan view illustrating a part of a semiconductor device on which the circuit illustrated in FIG. 13 is mounted.
Figure 15:
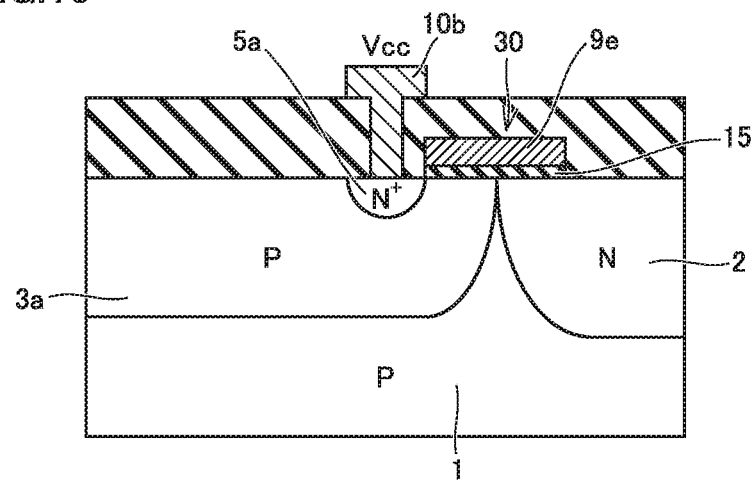
FIG. 15 is a schematic sectional view taken along line XV-XV in FIG. 14.
Figure 16:
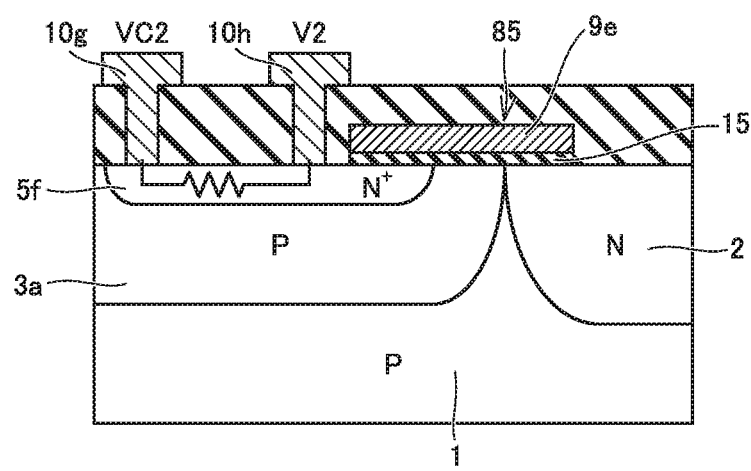
FIG. 16 is a schematic sectional view taken along line XVI-XVI in FIG. 14.
Figure 17:
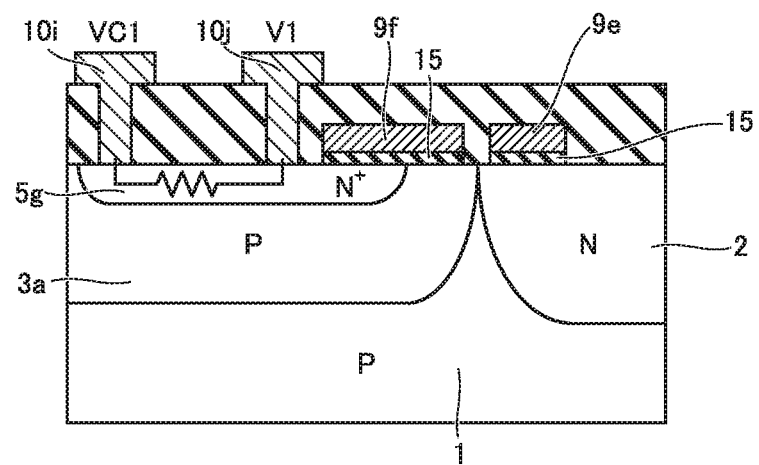
FIG. 17 is a schematic sectional view taken along line XVII-XVII in FIG. 14.
Figure 18:
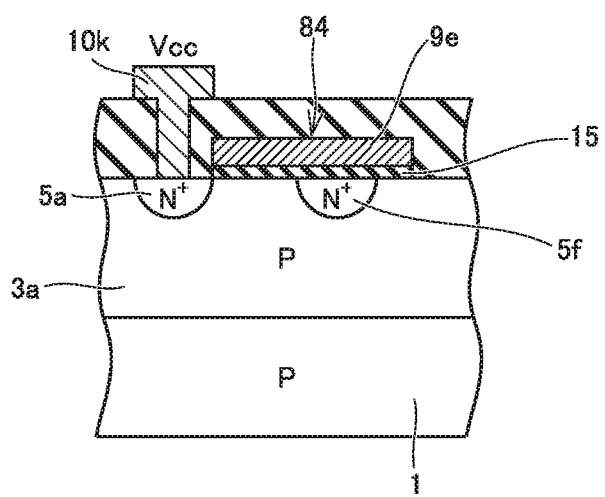
FIG. 18 is a schematic sectional view taken along line XVIII-XVIII in FIG. 14.

FIG. 13 is a circuit diagram illustrating a potential detection circuit in a semiconductor device according to a fifth embodiment. FIG. 14 is a schematic plan view illustrating a part of a semiconductor device on which the circuit illustrated in FIG. 13 is mounted. FIG. 15 is a schematic sectional view taken along line XV-XV in FIG. 14. FIG. 16 is a schematic sectional view taken along line XVI-XVI in FIG. 14. FIG. 17 is a schematic sectional view taken along line XVII-XVII in FIG. 14. FIG. 18 is a schematic sectional view taken along line XVIII-XVIII in FIG. 14.

The semiconductor device illustrated in FIGS. 13 to 18 basically has the same configuration as the semiconductor device illustrated in FIGS. 1 and 2 except in that it includes a determination circuit 80 for determining the potential of the first node 71 connected to the first electrode of the bootstrap capacitor 39. The determination circuit 80 mainly includes a first charging circuit 81, a second charging circuit 82, a first switch element 83, a second switch element 84, a third switch element 85, a comparator 62, and a gate control circuit 61. The first charging circuit 81 includes a first capacitor 81a, a first charging node 81b, a first resistor 81c, and a first diode 81d. The first capacitor 81a has two electrodes. One electrode of the first capacitor 81a is grounded, and the other electrode of the first capacitor 81a is electrically connected to the first charging node 81b. The first diode 81d is connected in parallel with the first capacitor 81a.

The second charging circuit 82 includes a second capacitor 82a, a second charging node 82b, a second resistor 82c, and a second diode 82d. The second capacitor 82a has two electrodes. One electrode of the second capacitor 82a is grounded, and the other electrode of the second capacitor 82a is electrically connected to the second charging node 82b. The second diode 82d is connected in parallel with the second capacitor 82a.

The source of the first switch element 83 is connected to the seventh node 77, from which the power supply voltage (Vcc) is supplied. The drain of the first switch element 83 is connected to the first charging node 81b. The first charging node 81b is connected to the comparator 62.

The source of the second switch element 84 is connected to the seventh node 77, from which the power supply voltage (Vcc) is supplied. The drain of the second switch element 84 is connected to the second charging node 82b. The second charging node 82b is connected to the comparator 62. The second charging node 82b is also connected to the source of the third switch element 85. The drain of the third switch element 85 is connected to the first node 71. The drain of the transistor 30 is connected to the first node 71. The source of the transistor 30 is connected to the seventh node 77. The gate electrode of the transistor 30, the gate electrode of the first switch element 83, the gate electrode of the second switch element 84, and the gate electrode of the third switch element 85 are connected to the gate control circuit 61. The output of the comparator 62 is input to the gate control circuit 61.

The power supply voltage (Vcc) is supplied to the first charging node 81b via the first switch element 83. The power supply voltage (Vcc) is supplied to the second charging node 82b via the second switch element 84. The first capacitor 81a and the second capacitor 82a have the same capacitance. The second charging node 82b is connected to the first node 71 via the third switch element 85. When the voltage of the second charging node 82b is greater than the voltage of the first charging node 81b, the determination circuit 80 determines that the voltage of the first node 71 is greater than the power supply voltage (Vcc).

FIG. 14 illustrates a planar layout of the semiconductor device in which the circuit illustrated in FIG. 13 is mounted. FIG. 14 illustrates the planar shapes of an electrode layer serving as the gate electrode of the transistor 30, the first switch element 83, the second switch element 84 and the third switch element 85, and the $N^+$-type diffusion regions 5a, 5f, and 5g serving as the source region or the drain region. The transistor 30 and the like are arranged along a boundary between the N-type diffusion region 2 and the P-type diffusion region 3a. Specifically, an $N^+$-type diffusion region 5a is formed on the surface of the P-type diffusion region 3a so as to extend along the boundary. An $N^+$-type diffusion region 5f is formed on the surface of the P-type diffusion region 3a at a position separated from the $N^+$-type diffusion region 5a along the boundary. The $N^+$-type diffusion region 5f extends in a direction away from the boundary. An $N^+$-type diffusion region 5g is formed on the surface of the P-type diffusion region 3a at a position separated from the N+-type diffusion region 5f along the boundary. The N+-type diffusion region 5g extends in a direction away from the boundary. In other words, the N+-type diffusion region 5f and the N+-type diffusion region 5g are formed so as to extend substantially parallel to each other. The N+-type diffusion region 5a is formed on the surface of the P-type diffusion region 3a at a position separated from the N+-type diffusion region 5g along the boundary. The N+-type diffusion region 5a extends along the boundary.

A gate electrode 9g is formed to extend from a position adjacent to the N+-type diffusion region 5a across the surface of the P-type diffusion region 3a to the N-type diffusion region 2. An insulating film 15 is disposed below the gate electrode 9g as a gate insulating film. A first electrode layer 9e is formed to be separated from the gate electrode 9g along the boundary. An insulating film 15 is formed below the first electrode layer 9e as a gate insulating film. The first electrode layer 9e is arranged adjacent to the N+-type diffusion region 5a and configured to cover a part of the N+-type diffusion region 5f. The first electrode layer 9e extends from the P-type diffusion region 3a across the boundary to the N-type diffusion region 2.

A second electrode layer 9f is formed so as to be separated from the first electrode layer 9e along the boundary. An insulating film 15 is formed below the second electrode layer 9f as a gate insulating film. The second electrode layer 9f is arranged adjacent to the other N+-type diffusion region 5a and configured to cover a part of the N+-type diffusion region 5g. The second electrode layer 9f is formed only on the P-type diffusion region 3a. The second electrode layer 9f is arranged at a position separated from the boundary. A gate electrode 9h is formed to extend from a position adjacent to the other N+-type diffusion region 5a across the surface of the P-type diffusion region 3a to the N-type diffusion region 2. An insulating film 15 is disposed below the gate electrode 9h as a gate insulating film.

As illustrated in FIG. 14, the gate electrode 9g of the transistor 30 is disposed between the N+-type diffusion region 5a and the N-type diffusion region 2. A portion of the first electrode layer 9e located between the N+-type diffusion region 5a and the N-type diffusion region 2 serves as a gate electrode of the transistor 30. A portion of the first electrode layer 9e located between the N+-type diffusion region 5a and the N+-type diffusion region 5f serves as a gate electrode of the second switch element 84. A portion of the first electrode layer 9e located between the N+-type diffusion region 5f and the N-type diffusion region 2 serves as a gate electrode of the third switch element 85. A portion of the second electrode layer 9f located between the other N+-type diffusion region 5a and the N+-type diffusion region 5g serves as a gate electrode of the first switch element 83. The gate electrode 9g of the transistor 30 is arranged between the other N+-type diffusion region 5a and the N-type diffusion region 2.

<Effect of Semiconductor Device>

The semiconductor device according to the present embodiment includes a determination circuit 80. The determination circuit 80 determines whether or not the voltage of the first node 71 on the current path between the first electrode of the bootstrap capacitor 39 and the first semiconductor region (the N+-type diffusion region 5b and the N-type diffusion region 2) is greater than the power supply voltage (Vcc). The determination circuit 80 includes a first charging circuit 81, a second charging circuit 82, a first switch element 83, a second switch element 84, and a third switch element 85. The first charging circuit 81 includes a first capacitor 81a and a first charging node 81b. The first capacitor 81a has two electrodes. One electrode of the first capacitor 81a is grounded. The other electrode of the first capacitor 81a is electrically connected to the first charging node 81b.

The second charging circuit 82 includes a second capacitor 82a and a second charging node 82b. The second capacitor 82a has two electrodes. One electrode of the second capacitor 82a is grounded. The other electrode of the second capacitor 82a is electrically connected to the second charging node 82b. The first charging node 81b is supplied with the power supply voltage (Vcc) via the first switch element 83. The second charging node 82b is supplied with the power supply voltage (Vcc) via the second switch element 84. The first capacitor 81a and the second capacitor 82a have the same capacitance. The second charging node 82b is connected to the first node 71 via the third switch element 85. When the voltage of the second charging node 82b is greater than the voltage of the first charging node 81b, the determination circuit 80 determines that the voltage of the first node 71 is greater than the power supply voltage (Vcc).

Since the determination circuit 80 may determine whether or not the voltage of the first node 71 is greater than the power supply voltage, it is possible to perform or terminate the charging operation on the bootstrap capacitor 39 based on the determination result.

In the bootstrap charging system included in the semiconductor device according to each of the embodiments described above, it is desirable to reliably terminate the charging operation on the bootstrap capacitor 39 when the potential (VB) of the first node 71 is greater than the potential (VS) of the third node 73 or the power supply voltage (Vcc). To this end, it is desirable that the potential (VB) of the first node 71 may be indirectly monitored on the low potential side.

In the determination circuit 80 illustrated in FIG. 13, two switch elements having the same characteristics are used respectively as the first switch element 83 and the second switch element 84, two resistors having the same resistance value are used respectively as the first resistor 81c and the second resistor 82c, two elements having the same capacitance value are used respectively as the first capacitor 81a and the second capacitor 82a, and two diodes having the same characteristics are used respectively as the first diode 81d and the second diode 82d so as to constitute two charging circuits. The first charging node 81b and the second charging node 82b are connected to the comparator 62 so as to monitor the voltage of the first charging node 81b and the voltage of the second charging node 82b. As illustrated in FIG. 13, the second charging node 82b is connected to the source of the third switch element 85 which is a high breakdown voltage MOST transistor similar to the transistor 30. The drain of the third switch element 85 is connected to the first node 71. On the other hand, in the first charging node 81b, as illustrated in the cross-sectional view of FIG. 17, a gap is formed between the second electrode layer 9f and the first electrode layer 9e so as to prevent the surface layer of the P-type diffusion region 3a below the second electrode layer 9f which serves as the gate electrode of the high breakdown voltage NchMOS transistor from becoming a channel. The source of the first switch element 83 and the source of the second switch element 84 are supplied with the power supply voltage (Vcc), and controlled by the gate control circuit 61.

When the gate of the first switch element 83 and the gate of the second switch element 84 are turned on, the currents flow through the first switch element 83 and the second switch element 84, and the first resistor 81c and the second resistor 82c to charge the first capacitor 81a and the second capacitor 82a, respectively. At this time, the third switch element 85 on the side of the second switch element 84 is also turned on. Therefore, if the potential (VB) of the first node 71 becomes lower than the power supply voltage (Vcc), a part of the current of the second switch element 84 flows through the third switch element 85 toward the first node 71. As a result, the current flowing through the second resistor 82c becomes smaller than the current flowing through the first resistor 81c, and thereby, the potential (V1) of the first charging node 81b is greater than the potential (V2) of the second charging node 82b.

When the potential (VB) of the first node 71 is greater than the power supply voltage (Vcc) and the potential (V2) of the second charging node 82b is lower than the power supply voltage (Vcc), the currents from both the second switch element 84 and the third switch element 85 flow through the second resistor 82c. In this case, the potential (V1) of the first charging node 81b is smaller than the potential (V2) of the second charging node 82b. Since the potential (V1) of the first charging node 81b is equal to or lower than the power supply voltage (Vcc), even if the potential (V2) of the second charging node 82b becomes greater than the power supply voltage (Vcc), the potential (V1) of the first charging node 81b is lower than the potential (V2) of the second charging node 82b.

By comparing the potential (V1) of the first charging node 81b and the potential (V2) of the second charging node 82b using the comparator 62, it is possible to determine that the potential (VB) of the first node 71 becomes equal to or greater than the power supply voltage (Vcc). The determination result is fed back to the gate control circuit 61, the gate control circuit 61 turns off the gates of the first switch element 83, the second switch element 84 and the third switch element 85, and thereby, it is possible to terminate the charging operation on the bootstrap capacitor 39 via the first node 71. In the determination circuit 80, in order to further improve the determination accuracy, the power supply voltage (Vcc) may be input to the comparator 62 as a reference of the potential (V1) of the first charging node 81b and the potential (V2) of the second charging node 82b.

Sixth Embodiment

<Configuration of Semiconductor Device>

Figure 19:
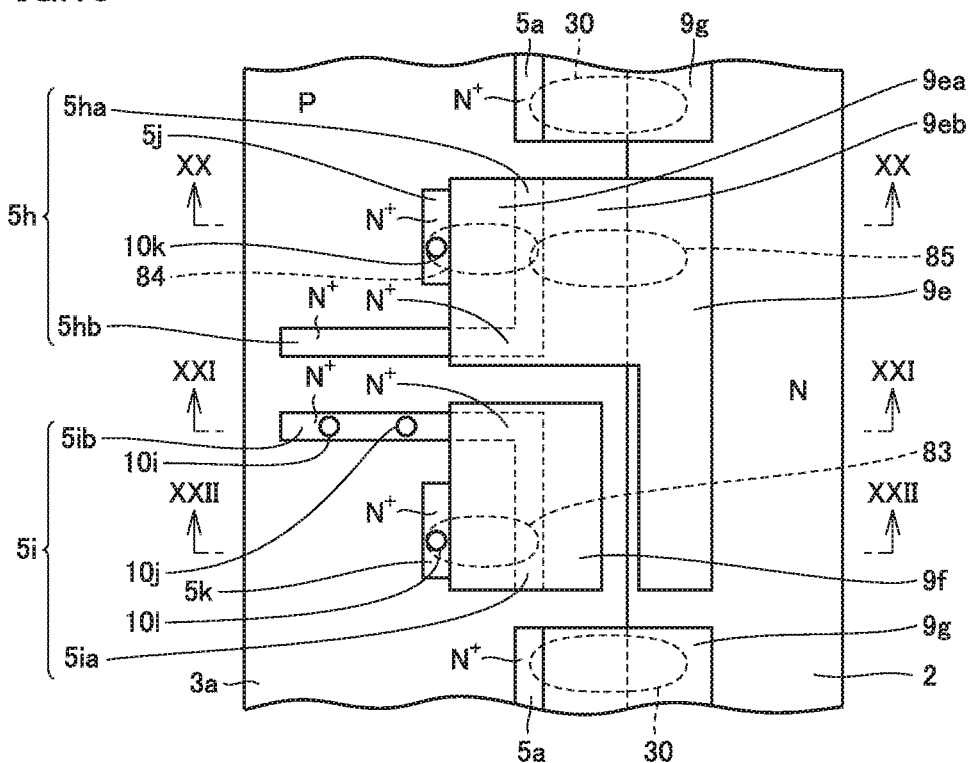
FIG. 19 is a schematic plan view illustrating a part of a semiconductor device according to a sixth embodiment.
Figure 20:
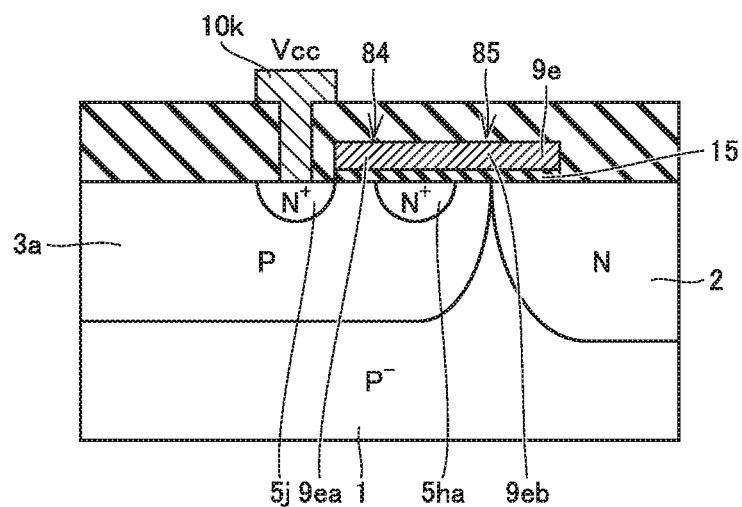
FIG. 20 is a schematic sectional view taken along line XX-XX of FIG. 19.
Figure 21:
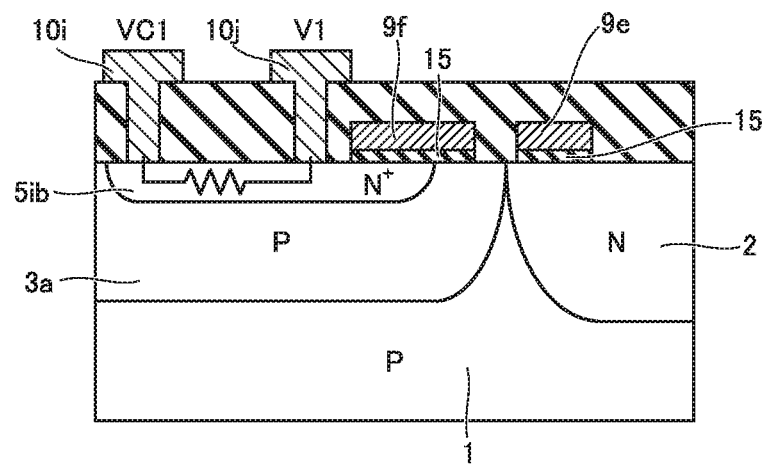
FIG. 21 is a schematic sectional view taken along line XXI-XXI in FIG. 19.
Figure 22:
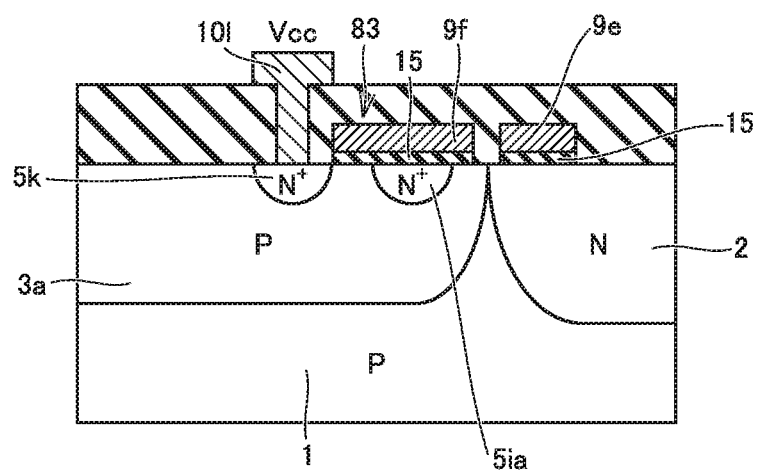
FIG. 22 is a schematic sectional view taken along line XXII-XXII in FIG. 19.

FIG. 19 is a schematic plan view illustrating a part of a semiconductor device according to a sixth embodiment, FIG. 20 is a schematic sectional view taken along line XX-XX of FIG. 19, FIG. 21 is a schematic sectional view taken along line XXI-XXI in FIG. 19, and FIG. 22 is a schematic sectional view taken along line XXII-XXII in FIG. 19.

The semiconductor devices illustrated in FIGS. 19 to 22 basically have the same configuration as the semiconductor layers illustrated in FIGS. 13 to 18 except that the planar shapes of the N$^+$-type diffusion regions 5h, 5i and 5j, the first electrode layer 9e and the second electrode layer 9f constituting each switch element and the like are different from those in the semiconductor device illustrated in FIGS. 13 to 18.

Similar to FIG. 14, FIG. 19 illustrates the planar shapes of an electrode layer serving as the gate electrode of the transistor 30, the first switch element 83, the second switch element 84 and the third switch element 85, and the N$^+$-type diffusion regions 5a, 5h, 5i, 5j and 5k serving as the source region or the drain region. Specifically, an N$^+$-type diffusion region 5a is formed on the surface of the P-type diffusion region 3a so as to extend along a boundary between the N-type diffusion region 2 and the P-type diffusion region 3a. An N$^+$-type diffusion region 5h is formed on the surface of the P-type diffusion region 3a at a position separated from the N$^+$-type diffusion region 5a along the boundary. The N$^+$-type diffusion region 5h includes a first portion 5ha extending along the boundary and a second portion 5hb contiguous with the first portion 5ha and extending in a direction away from the boundary. An N$^+$-type diffusion region 5j is formed in a region located at the other side of the boundary relative to the first portion 5ha.

An N$^+$-type diffusion region 5i is formed on the surface of the P-type diffusion region 3a at a position separated from the N$^+$-type diffusion region 5h along the boundary. The N$^+$-type diffusion region 5i includes a first portion 5ia extending along the boundary and a second portion 5ib contiguous with the first portion 5ia and extending in a direction away from the boundary. An N$^+$-type diffusion region 5k is formed in a region at the other side of the boundary relative to the first portion 5ia. The planar shape of the N$^+$-type diffusion region 5h and the planar shape of the N$^+$-type diffusion region 5j are line-symmetrical about a center line located between the second portion 5hb and the second portion 5ib and extending parallel to the second portion 5hb, and similarly, the planar shape of the N$^+$-type diffusion region 5i and the planar shape of the N$^+$-type diffusion region 5k are line-symmetrical about the center line. An N$^+$-type diffusion region 5a is formed on the surface of the P-type diffusion region 3a at a position separated from the N$^+$-type diffusion region 5i along the boundary. The N$^+$-type diffusion region 5a extends along the boundary.

A gate electrode 9g is formed to extend from a position adjacent to the N$^+$-type diffusion region 5a across the surface of the P-type diffusion region 3a to the N-type diffusion region 2. An insulating film 15 is disposed below the gate electrode 9g as a gate insulating film. A first electrode layer 9e is formed to be separated from the gate electrode 9g along the boundary. An insulating film 15 is formed below the first electrode layer 9e as a gate insulating film. The first electrode layer 9e is arranged adjacent to the N$^+$-type diffusion region 5j and configured to cover the first portion 5ha of the N$^+$-type diffusion region 5h. The first electrode layer 9e extends from the P-type diffusion region 3a across the boundary to the N-type diffusion region 2. In the planar view, the N$^+$-type diffusion region 5h is arranged to divide the first electrode layer 9e into a first electrode portion 9ea on the side of the N$^+$-type diffusion region 5j and a second electrode portion 9eb on the side of the N-type diffusion region 2.

A second electrode layer 9f is formed to be separated from the first electrode layer 9e along the boundary. An insulating film 15 is formed below the second electrode layer 9f as a gate insulating film. The second electrode layer 9f is arranged adjacent to the other N$^+$-type diffusion region 5a and configured to cover a part of the N$^+$-type diffusion region 5g. The second electrode layer 9f is formed only on the P-type diffusion region 3a. The second electrode layer 9f is arranged at a position separated from the boundary. A gate electrode 9g is formed to extend from a position adjacent to the other N$^+$-type diffusion region 5a across the surface of the P-type diffusion region 3a to the N-type diffusion region 2. An insulating film 15 is disposed below the gate electrode 9g as a gate insulating film.

As illustrated in FIG. 19, the gate electrode 9g of the transistor 30 is disposed between the N$^+$-type diffusion region 5a and the N-type diffusion region 2. A portion of the first electrode layer 9e located between the N$^+$-type diffusion region 5j and the first portion 5ha of the N⁺-type diffusion region 5h serves as a gate electrode of the second switch element 84. A portion of the first electrode layer 9e located between the first portion 5ha of the N⁺-type diffusion region 5h and the N-type diffusion region 2 serves as a gate electrode of the third switch element 85. A portion of the second electrode layer 9f located between the N⁺-type diffusion region 5k and the first portion 5ia of the N⁺-type diffusion region 5i serves as a gate electrode of the first switch element 83. The gate electrode 9g of the transistor 30 is arranged between the other N⁺-type diffusion region 5a and the N-type diffusion region 2.

<Effect of Semiconductor Device>

The semiconductor device according to the present embodiment includes a fifth semiconductor region of the second conductivity type (the N⁺-type diffusion region 5j), a sixth semiconductor region of the second conductivity type (the N⁺-type diffusion region 5h), a seventh semiconductor region of the second conductivity type (the N⁺-type diffusion region 5k), and an eighth semiconductor region of the second conductivity type (the N⁺-type diffusion region 5i). The fifth semiconductor region (the N⁺-type diffusion region 5j) is formed in the second semiconductor region (the P-type diffusion region 3a) and is separated from the third semiconductor region (the N⁺-type diffusion region 5a). The sixth semiconductor region (the N⁺-type diffusion region 5h) is formed in the second semiconductor region (the P-type diffusion region 3a) and is separated from the fifth semiconductor region (the N⁺-type diffusion region 5j). The seventh semiconductor region (the N⁺-type diffusion region 5k) is formed in the second semiconductor region (the P-type diffusion region 3a) and is separated from the fifth semiconductor region (the N⁺-type diffusion region 5j). The eighth semiconductor region (the N⁺-type diffusion region 5i) is formed in the second semiconductor region (the P-type diffusion region 3a) and is separated from the seventh semiconductor region (the N⁺-type diffusion region 5k). The sixth semiconductor region (the N⁺-type diffusion region 5h) includes a first portion 5ha which is formed closer to the first semiconductor region (the N-type diffusion region 2) than the fifth semiconductor region (the N⁺-type diffusion region 5j) and is separated from the first semiconductor region (the N-type diffusion region 2). The semiconductor device further includes a first electrode layer 9e and a second electrode layer 9f. The first electrode layer 9e is formed to extend from a position between the fifth semiconductor region (the N⁺-type diffusion region 5j) and the first portion 5ha across the first portion 5ha to the first semiconductor region (the N-type diffusion region 2). The first electrode layer 9e is arranged with the first insulating film (the insulating film 15) interposed therebetween. The second electrode layer 9f is formed to extend from a position between the seventh semiconductor region (the N⁺-type diffusion region 5k) and the eighth semiconductor region (the N⁺-type diffusion region 5i) to the eighth semiconductor region (the N⁺-type diffusion region 5i). The second electrode layer 9f is arranged with the second insulating film (the insulating film 15) interposed therebetween. The second electrode layer 9f is disposed at a position separated from the boundary between the first semiconductor region (the N-type diffusion region 2) and the second semiconductor region (the P-type diffusion region 3a). In a planar view, the sixth semiconductor region (the N⁺-type diffusion region 5h) is formed so as to divide the first electrode layer 9e into a first electrode portion 9ea on the side of the fifth semiconductor region (the N⁺-type diffusion region 5j) and a second electrode portion 9eb on the side of the first semiconductor region (the N-type diffusion region 2). The fifth semiconductor region (the N⁺-type diffusion region 5j) is a source region for the second switch element 84. The first portion 5ha is a drain region for the second switch element 84 and a source region for the third switch element 85. The first semiconductor region (the N-type diffusion region 2) is a drain region for the third switch element 85. The first electrode portion 9ea of the first electrode layer 9e is a gate electrode of the second switch element 84. The second electrode portion 9eb of the first electrode layer 9e is a gate electrode of the third switch element 85. The seventh semiconductor region (the N⁺-type diffusion region 5k) is a source region for the first switch element 83. The eighth semiconductor region (the N⁺-type diffusion region 5i) is a drain region for the first switch element 83. The second electrode layer 9f is a gate electrode of the first switch element 83.

Since the N⁺-type diffusion region 5h is formed to divide the first electrode layer 9e into the first electrode portion 9ea on the side of the fifth semiconductor region (the N⁺-type diffusion region 5j) and the second electrode portion 9eb on the side of the first semiconductor region (the N-type diffusion region 2), it is possible to prevent the fifth semiconductor region (the N⁺-type diffusion region 5j) from functioning as the source region for the third switch element 85.

In other words, the N⁺-type diffusion region 5h is configured to surround the N⁺-type diffusion region 5j. By adopting this configuration, the N⁺-type diffusion region 5j which serves as the source of the second switch element 84 may be prevented from functioning as the source of the third switch element 85 as much as possible. Similarly to the semiconductor device illustrated in FIG. 14, the second electrode layer 9f is separated from the first electrode layer 9e so that the high breakdown voltage NchMOS transistor does not operate between the first portion 5ia of the N⁺-type diffusion region 5i and the N-type diffusion region 2. By adopting this configuration, it is possible to prevent the current from being generated by the parasitic MOS structure not shown in the circuit diagram. As a result, it is possible for the determination circuit 80 to stably output a signal voltage for detecting the potential (VB) of the first node 71, preventing the malfunction of the determination circuit 80.

Seventh Embodiment

<Configuration of Semiconductor Device>

Figure 23:
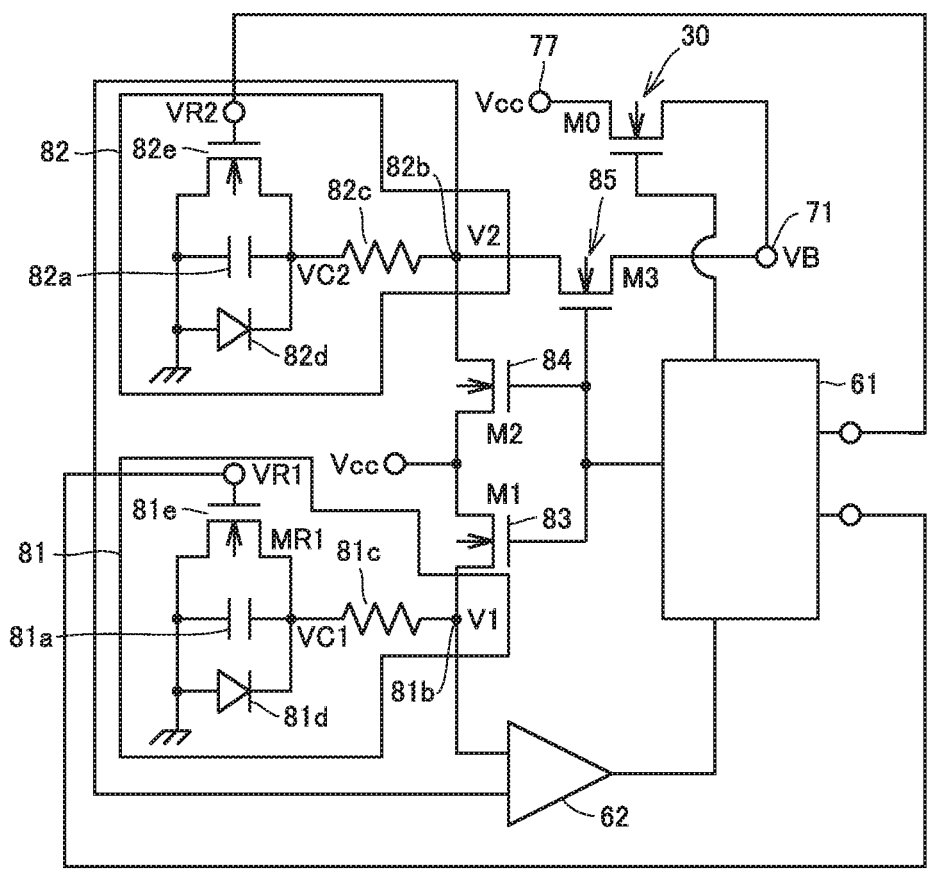
FIG. 23 is a circuit diagram illustrating a potential detection circuit in the semiconductor device according to a seventh embodiment.

FIG. 23 is a circuit diagram illustrating a potential detection circuit in the semiconductor device according to the seventh embodiment. The semiconductor device illustrated in FIG. 23 basically has the same configuration as the semiconductor device illustrated in FIG. 13 except that the configuration of the first charging circuit 81 and the configuration of the second charging circuit 82 in the determination circuit 80 are different from those in the semiconductor device illustrated in FIG. 13. In other words, in the semiconductor device illustrated in FIG. 23, the first charging circuit 81 includes a fourth switch element 81e, and the second charging circuit 82 includes a fifth switch element 82e. The fourth switch element 81e is connected in parallel to the first capacitor 81a. The fifth switch element 82e is connected in parallel to the second capacitor 82a.

<Effect of Semiconductor Device>

The semiconductor device according to the present embodiment includes a fourth switch element 81e and a fifth switch element 82e. The fourth switch element 81e is connected in parallel to the first capacitor 81a. The fifth switch element 82e is connected in parallel to the second capacitor 82a. When the first switch element 83 and the second switch element 84 are turned off, the fourth switch element 81e and the fifth switch element 82e are turned on, and the first capacitor 81a and the second capacitor 82a are discharged.

Thus, by controlling the fourth switch element 81e and the fifth switch element 82e, it is possible to reliably discharge the first capacitor 81a of the first charging circuit 81 and the second capacitor 82a of the second charging circuit 82 and reset the same to the initial state.

In the determination circuit 80 of the semiconductor device illustrated in FIG. 13, the state of the first capacitor 81a and the state of the second capacitor 82a are subjected to the influence of the discharge immediately after the completion of the previous charge or the subsequent discharge. Therefore, the initial state of the first capacitor 81a and the initial state of the second capacitor 82a at each charging operation may be different. Therefore, contrary to the circuit operation assumed in the semiconductor device illustrated in FIG. 13, for example, when the potential (V2) of the second charging node 82b is greater than the potential (V1) of the first charging node 81b in the initial state, the potential (VB) of the first node 71 may be immediately determined as being greater than the power supply voltage (Vcc), which may terminate the charging operation.

Therefore, if the first charging circuit 81 includes the fourth switch element 81e and the second charging circuit 82 includes the fifth switch element 82e as in the semiconductor device illustrated in FIG. 23, it is possible to stabilize the voltage (VC1) of the first capacitor 81a and the voltage (VC2) of the second capacitor 82a in the determination circuit 80, which makes the operation of the determination circuit 80 stable. For example, while the gate of the first switch element 83 and the gate of the second switch element 84 are being turned off so as to perform the charging operation, the gate of the fourth switch element 81e and the gate of the fifth switch element 82e are turned on. In this way, it is possible to release the residual charges of the first capacitor 81a and the second capacitor 82a so as to reset the capacitors to the initial state, preventing the malfunction of the determination circuit 80.

It should be understood that the embodiments disclosed herein have been presented for the purpose of illustration and description but not limited in all aspects. It is intended that the scope of the present disclosure is not limited to the description above but defined by the scope of the claims and encompasses all modifications equivalent in meaning and scope to the claims.

What is claimed is:

1. A semiconductor device that supplies a charging current to charge a target element, comprising:
   a semiconductor layer of a first conductivity type;
   a first semiconductor region of a second conductivity type which is formed on a main surface of the semiconductor layer and is electrically connected to a first electrode of the target element;
   a second semiconductor region of the first conductivity type which is formed on the main surface of the semiconductor layer and is arranged adjacent to the first semiconductor region;
   a third semiconductor region of the second conductivity type which is formed on a surface of the second semiconductor region and is supplied with a power supply voltage;
   a source electrode which is connected to the third semiconductor region and is supplied with the power supply voltage;
   a drain electrode which is connected to the first semiconductor region and is electrically connected to the first electrode;
   a back gate electrode which is connected to a region in the second semiconductor region separated from the third semiconductor region and is grounded;
   a gate electrode which is arranged to face a channel region located in the second semiconductor region between the third semiconductor region and the first semiconductor region with a gate insulating film interposed therebetween;
   a fourth semiconductor region of the second conductivity type which is formed in the second semiconductor region and arranged to surround the periphery of the third semiconductor region and isolate the third semiconductor region from the second semiconductor region,
   a breakdown voltage between the source electrode and the back gate electrode being greater than the power supply voltage,
   the fourth semiconductor region extends from the periphery of the third semiconductor region to a region in the second semiconductor region which is opposed to the first semiconductor region and separated from the first semiconductor region, and
   the channel region is arranged in the second semiconductor region between the fourth semiconductor region and the first semiconductor region.

2. The semiconductor device according to claim 1, further comprising: a limit resistance arranged on a current path from a power source, which supplies the power source voltage, to the channel region.

3. The semiconductor device according to claim 2, wherein the limit resistance is a portion of the fourth semiconductor region located between the third semiconductor region and the channel region.

4. The semiconductor device according to claim 1, further comprising:
   a determination circuit which determines whether or not a voltage of a first node on a current path between the first electrode and the first semiconductor region is greater than the power supply voltage,
   wherein the determination circuit includes a first charging circuit, a second charging circuit, a first switch element, a second switch element, and a third switch element,
   the first charging circuit includes a first capacitor and a first charging node,
   the first capacitor has two electrodes,
   one electrode of the first capacitor is grounded, and the other electrode of the first capacitor is electrically connected to the first charging node,
   the second charging circuit includes a second capacitor and a second charging node,
   the second capacitor has two electrodes,
   one electrode of the second capacitor is grounded, and the other electrode of the second capacitor is electrically connected to the second charging node,
   the first charging node is supplied with the power supply voltage via the first switch element,
   the second charging node is supplied with the power supply voltage via the second switch element,
   the first capacitor and the second capacitor have the same capacitance,
   the second charging node is connected to the first node via the third switch element, and
   the determination circuit determines that the voltage of the first node is greater than the power supply voltage when the voltage of the second charging node is greater than the voltage of the first charging node.

5. The semiconductor device according to claim 4, further comprising:
a fifth semiconductor region of the second conductivity type which is formed in the second semiconductor region and is separated from the third semiconductor region;
a sixth semiconductor region of the second conductivity type which is formed in the second semiconductor region and is separated from the fifth semiconductor region;
a seventh semiconductor region of the second conductivity type which is formed in the second semiconductor region and is separated from the fifth semiconductor region; and
an eighth semiconductor region of the second conductivity type which is formed in the second semiconductor region and is separated from the seventh semiconductor region,
the sixth semiconductor region includes a first portion which is formed closer to the first semiconductor region than the fifth semiconductor region and is separated from the first semiconductor region,
the semiconductor device further includes
a first electrode layer which is formed to extend from a position between the fifth semiconductor region and the first portion across the first portion to the first semiconductor region and arranged with a first insulating film interposed therebetween, and
a second electrode layer which is formed to extend from a position between the seventh semiconductor region and the eighth semiconductor region to the eighth semiconductor region and arranged with a second insulating film interposed therebetween,
the second electrode layer is disposed at a position separated from a boundary between the first semiconductor region and the second semiconductor region,
in a planar view, the sixth semiconductor region is formed so as to divide the first electrode layer into a first electrode portion on a side of the fifth semiconductor region and a second electrode portion on the side of the first semiconductor region,
the fifth semiconductor region is a source region for the second switch element,
the first portion is a drain region for the second switch element and a source region for the third switch element,
the first semiconductor region is a drain region for the third switch element,
the first electrode portion of the first electrode layer is a gate electrode of the second switch element,
the second electrode portion of the first electrode layer is a gate electrode of the third switch element,
the seventh semiconductor region is a source region for the first switch element,
the eighth semiconductor region is a drain region for the first switch element, and
the second electrode layer is a gate electrode of the first switch element.

6. The semiconductor device according to claim 4, further comprising:
a fourth switch element which is connected in parallel to the first capacitor; and
a fifth switch element which is connected in parallel to the second capacitor,
when the first switch element and the second switch element are turned off, the fourth switch element and the fifth switch element are turned on, and the first capacitor and the second capacitor are discharged.

7. The semiconductor device according to claim 1, wherein
the breakdown voltage is 300 V or more.

* * * * *